(12) United States Patent
Lin

(10) Patent No.: US 11,842,958 B2
(45) Date of Patent: Dec. 12, 2023

(54) CONDUCTIVE STRUCTURE INCLUDING COPPER-PHOSPHOROUS ALLOY AND A METHOD OF MANUFACTURING CONDUCTIVE STRUCTURE

(71) Applicant: Chun-Ming Lin, Hsinchu County (TW)

(72) Inventor: Chun-Ming Lin, Hsinchu County (TW)

( * ) Notice: Subject to any disclaimer, the term of this patent is extended or adjusted under 35 U.S.C. 154(b) by 54 days.

(21) Appl. No.: 17/697,937

(22) Filed: Mar. 18, 2022

(65) Prior Publication Data

US 2023/0298991 A1 Sep. 21, 2023

(51) Int. Cl.
| | | |
|---|---|---|
| *H05K 1/09* | (2006.01) | |
| *H05K 1/11* | (2006.01) | |
| *H01L 23/498* | (2006.01) | |
| *C25D 7/12* | (2006.01) | |
| *H01L 21/48* | (2006.01) | |
| *C25D 3/38* | (2006.01) | |
| *H05K 1/18* | (2006.01) | |

(52) U.S. Cl.
CPC ......... *H01L 23/49866* (2013.01); *C25D 3/38* (2013.01); *C25D 7/12* (2013.01); *H01L 21/4857* (2013.01); *H01L 23/49822* (2013.01); *H01L 23/49827* (2013.01); *H05K 1/09* (2013.01); *H05K 1/112* (2013.01); *H05K 1/18* (2013.01); *H05K 2201/0332* (2013.01); *H05K 2201/0364* (2013.01); *H05K 2201/095* (2013.01); *H05K 2201/09509* (2013.01)

(58) Field of Classification Search
CPC ........... H01L 23/49866; H01L 21/4857; H01L 23/49822; H01L 23/49827; C25D 3/38; C25D 7/12
See application file for complete search history.

(56) References Cited

U.S. PATENT DOCUMENTS

| | | | | |
|---|---|---|---|---|
| 4,141,055 A | * | 2/1979 | Berry | ................... H01L 23/5381 |
| | | | | 174/253 |
| 5,373,111 A | * | 12/1994 | McClure | .............. H05K 13/046 |
| | | | | 361/767 |
| 6,013,578 A | * | 1/2000 | Jun | ................... H01L 23/53238 |
| | | | | 257/E21.575 |
| 6,969,915 B2 | | 11/2005 | Tago et al. | |

(Continued)

FOREIGN PATENT DOCUMENTS

| | | |
|---|---|---|
| CN | 101574663 A | 11/2009 |
| CN | 102064154 A * | 5/2011 |

(Continued)

OTHER PUBLICATIONS

English translation (machine translation) of CN102064154A, Published May 2011.*

(Continued)

*Primary Examiner* — Ishwarbhai B Patel
(74) *Attorney, Agent, or Firm* — WPAT, P.C., INTELLECTUAL PROPERTY ATTORNEYS; Anthony King

(57) ABSTRACT

The present disclosure provides a multilayer wiring structure, including a plurality of dielectric layers, a plurality of conductive wiring layers interleaved with the plurality of dielectric layers, wherein the plurality of conductive wiring layers includes copper-phosphorous alloys (such as $Cu_3P$).

23 Claims, 25 Drawing Sheets

(56) References Cited

U.S. PATENT DOCUMENTS

| | | | |
|---|---|---|---|
| 8,022,309 B2* | 9/2011 | Pai | H05K 1/0253 |
| | | | 174/254 |
| 9,591,753 B2* | 3/2017 | Wang | H05K 3/181 |
| 9,832,863 B2* | 11/2017 | Elsherbini | H05K 1/115 |
| 10,529,622 B1 | 1/2020 | Maniscalco | |
| 10,653,006 B2* | 5/2020 | Gabriel | H01Q 1/2225 |
| 2006/0170114 A1* | 8/2006 | Su | H01L 24/03 |
| | | | 257/784 |
| 2007/0056727 A1* | 3/2007 | Newman | E21B 41/00 |
| | | | 166/250.01 |
| 2011/0101521 A1* | 5/2011 | Hwang | H01L 21/76885 |
| | | | 257/737 |
| 2017/0042044 A1* | 2/2017 | Miyamoto | H05K 3/4661 |
| 2020/0411441 A1 | 12/2020 | Darmawikarta | |
| 2021/0335663 A1 | 10/2021 | Hsueh et al. | |
| 2022/0044941 A1 | 2/2022 | Liao et al. | |

FOREIGN PATENT DOCUMENTS

| | | | |
|---|---|---|---|
| CN | 103887494 B | | 6/2014 |
| CN | 105895886 B | | 8/2016 |
| JP | 2000307217 A | * | 11/2000 |
| TW | I591881 B | | 7/2017 |
| TW | 202201793 A | | 1/2022 |
| TW | 202209562 A | | 3/2022 |

OTHER PUBLICATIONS

R. Colin Johnson, "With Alkaline Chemistry, Copper Could Be Forever", EE Times, Dec. 2017 ( https://www.eetimes.com/with-alkaline-chemistry-copper-could-be-forever/# ).

Caillard et al., "Investigation of Cu/TaN and Co/TaN Barrier-Seed Oxidation by Acidic and Alkaline Copper Electroplating Chemistry for Damascene Applications", Journal of The Electrochemical Society, vol. 165, No. 10, Jul. 19, 2018.

Minchali Metal Industry Co., Ltd., "Minchali Metal Industry Co., Ltd. product" ( http://www.minchali.com.tw/products?id=1 ), provided with translation.

Hurricane Chemicals Co., Ltd., "520 Acid Plated Copper brightener (Acid Copper)" ( http://www.hurricane.com.tw/catalog/520.pdf ), provided with translation.

Surtek, Pyrophosphate Copper Plating Process ( http://www.surtek.com.tw/new_page_51.htm , http://www.surtek.com.tw/new_page_15.htm ).

Minchali Metal Industry Co., Ltd., "Minchali Product Pamphlet", Jan. 2015.

Sun Wing Technology Company, "Pyrophosphate Copper Plating", provided with translation.

Alexander Wolff et al., "Low-Temperature Tailoring of Copper-Deficient Cu3-XP—Electric Properties, Phase Transitions and Performance in Lithium-Ion Batteries", Chemistry of Materials, 2018.

Taro Kuwano et al., "Performance enhancement of ZnSnP2 solar cells by a Cu3P back buffer layer," Solar Energy Materials and Solar Cells, vol. 221, 110891, 2021.

Taro Kuwano et al.,"Improvement of Ohmic Behavior of Back Contact in ZnSnP2 Solar Cells by Inserting Cu3P," 2019 IEEE 46th Photovoltaic Specialists Conference (PVSC), 2019, pp. 3007-3009, doi: 10.1109/PVSC40753.2019.8980788.

Taro Kuwano et al.,"Impact of structure on carrier transport behavior at the interface between electrode and ZnSnP2 absorber," 2018 IEEE 7th World Conference on Photovoltaic Energy Conversion (WCPEC) (A Joint Conference of 45th IEEE PVSC, 28th PVSEC & 34th EU PVSEC), 2018, pp. 2998-2999, doi: 10.1109/PVSC.2018.8547478.

Alexander Wolff et al., "Resource-Efficient High-Yield Ionothermal Synthesis of Microcrystalline Cu3-xP", Inorganic Chemistry, vol. 55(17), pp. 8844-8851, 2016.

Jennifer Ann Aitken et al., "Solvothermal syntheses of Cu3P via reactions of amorphous red phosphorus with a variety of copper sources, Journal of Solid State Chemistry", vol. 178(4), pp. 970-975, 2005.

Shuling Liu et al., "Synthesis and characterization of hollow spherical copper phosphide (Cu3P) nanopowders", vol. 148, Issues 11-12, pp. 438-440, 2009.

Nopparuj Kochaputi et al., "Roles of supports on reducibility and activities of Cu3P catalysts for deoxygenation of bleic acid: In situ XRD and XAS studies", Molecular Catalysis, Feb. 12, 2021.

Daniel Torres et al., "Electrochemical formation of copper phosphide from aqueous solutions of Cu(II) and hypophosphite ions", Electrochimica Acta, Sep. 10, 2020, vol. 354.

Shuling Liu et al., "Surfactant-assisted synthesis and electrochemical performances of Cu3P dendrites", Materials Research Bulletin, Nov. 2012, pp. 3352-3356, vol. 47, Issue 11.

B. Mauvernay et al., "Redox mechanism in the binary transition metal phosphide Cu3P", Journal of Physics and Chemistry of Solids, 2006, p. 1252-1257, vol. 67.

Heriberto Pfeiffer et al., "Synthesis, characterization and electrochemical properties of copper phosphide (Cu3P) thick films prepared by solid-state reaction at low temperature: a probable anode for lithium ion batteries", Electrochimica Acta, 2005, p. 4763-4770, vol. 50.

Subodh Kumar et al., "Three-Dimensional Graphene-Decorated Copper-Phosphide (Cu3P@3DG) Heterostructure as an Effective Electrode for a Supercapacitor", Frontiers in Materials, 2020, Article 30, vol. 7.

English Abstact of CN101574663A.
English Abstract of CN103887494B.
English Abstract of CN105895886B.
English Abstract of TWI591881B.

Lo et al., "Effects of Additives on Filling Performance in Copper Electroplating and Conformal Copper Deposition in High-Aspect Ratio Trenches by Electroless Plating", 2007.

Office Action and search report issued by USPTO dated Sep. 29, 2022 for U.S. Appl. No. 17/815,613.

US20220367243A1 serving as an English translation of TW202209562A.

US11387233B2 serving as an English translation of TW202201793A.

* cited by examiner

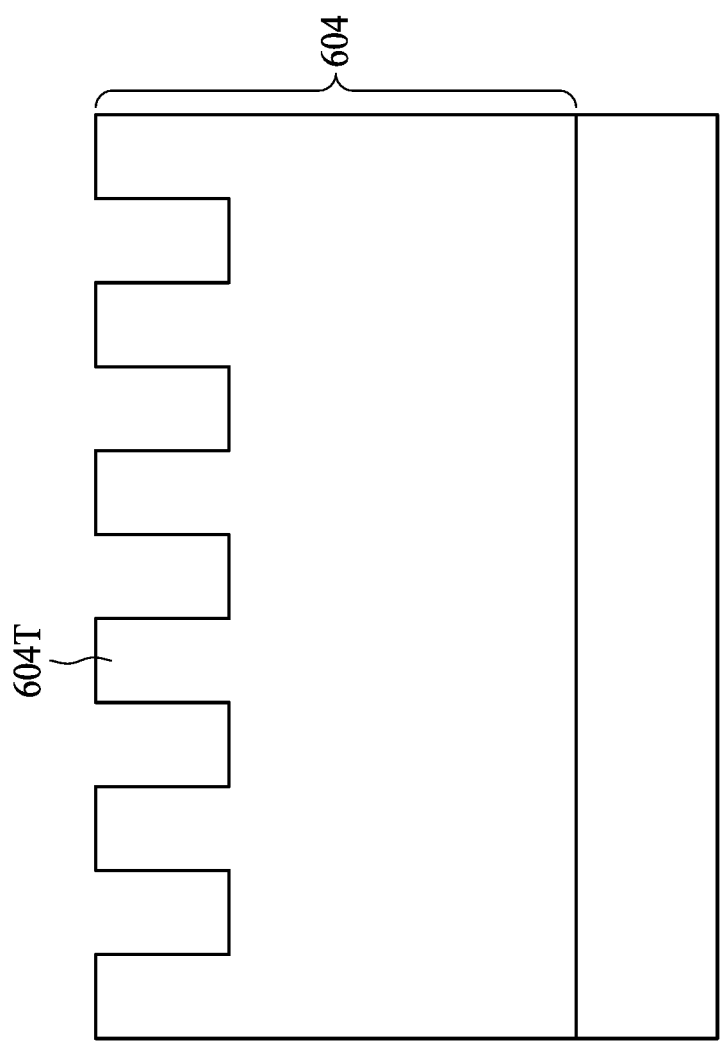

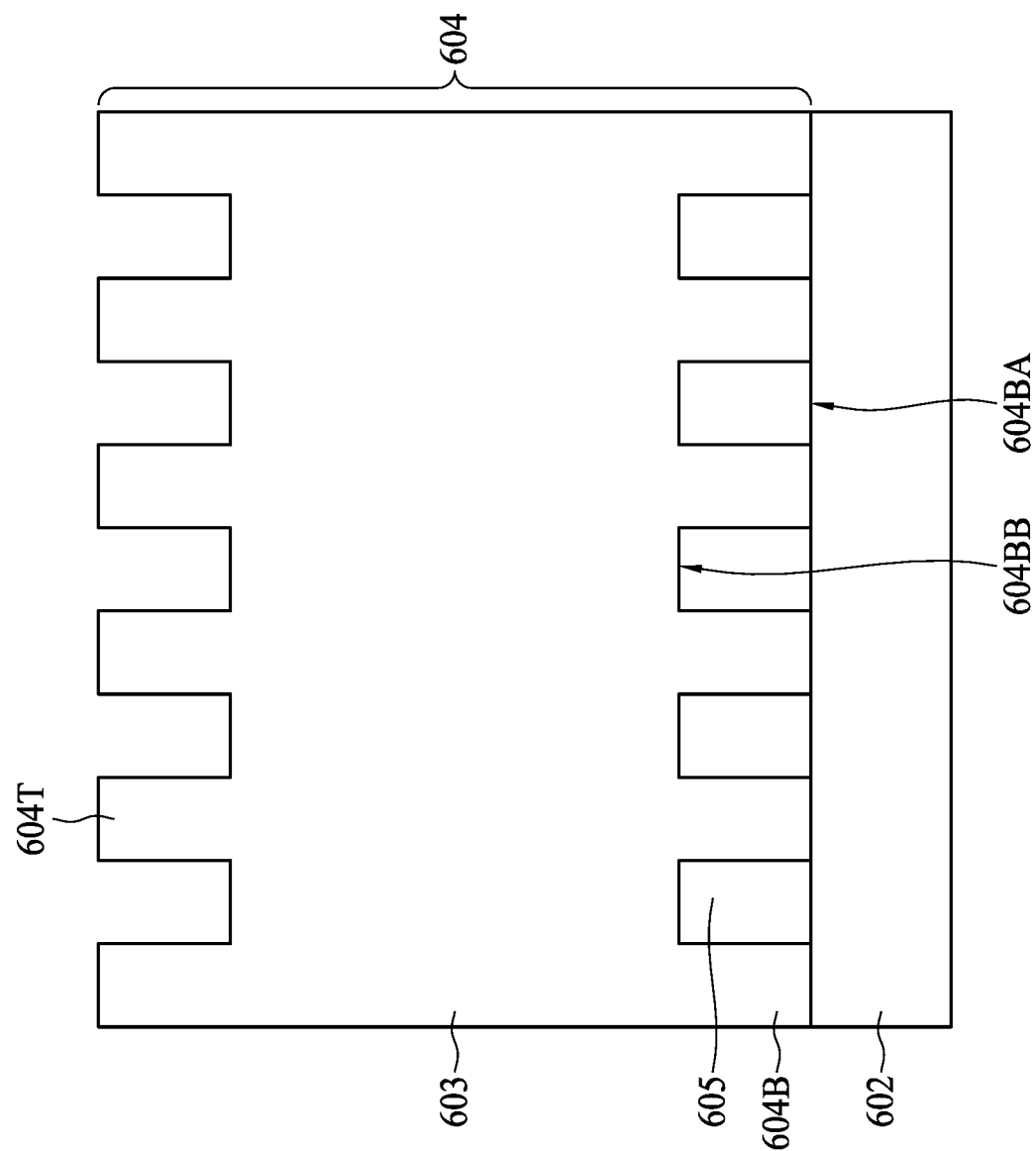
FIG. 6D"

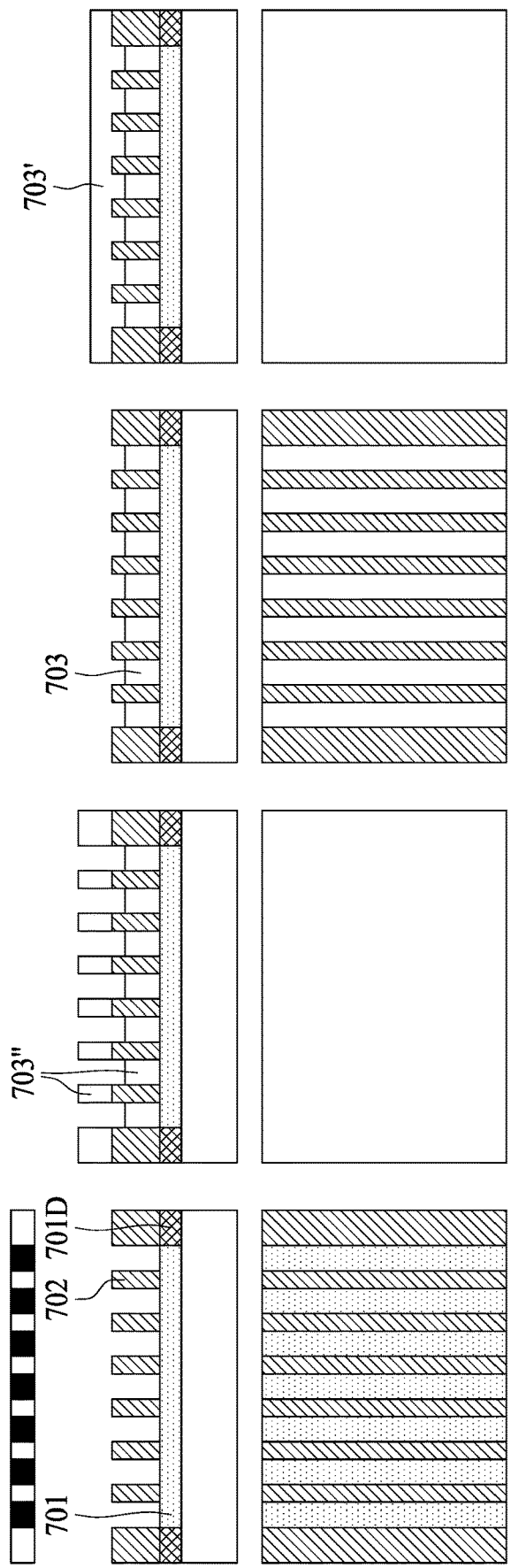

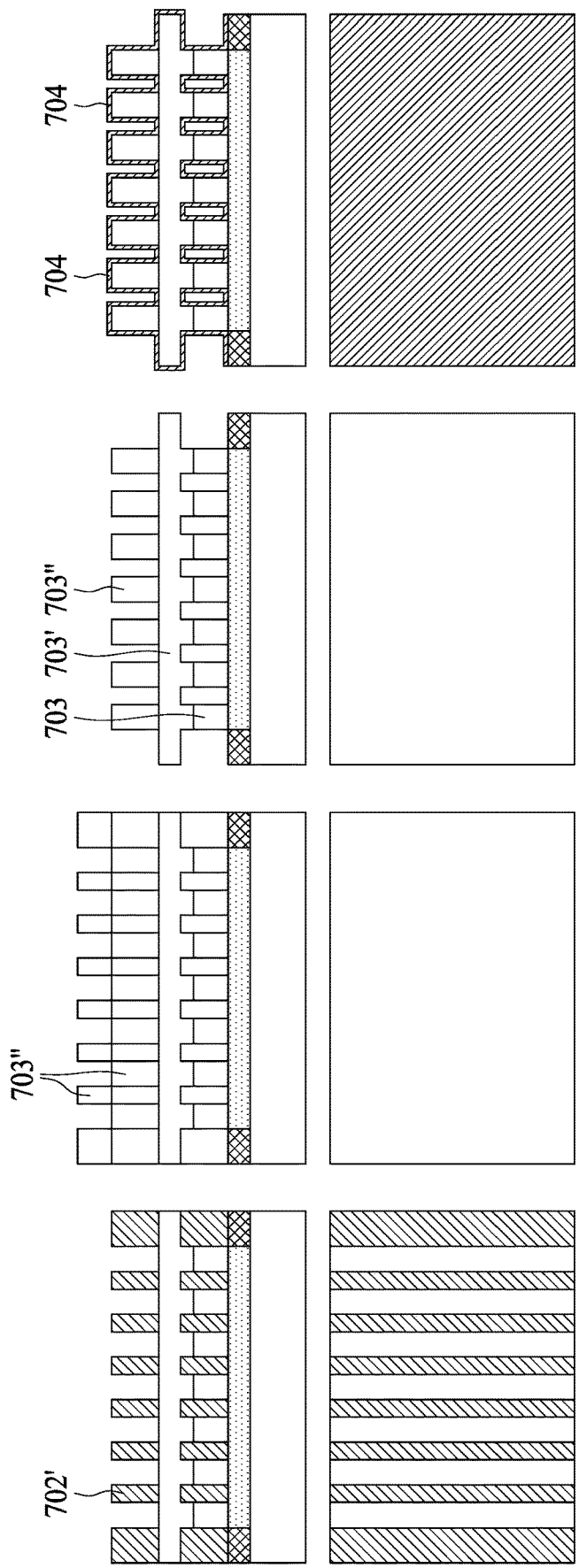

CONDUCTIVE STRUCTURE INCLUDING COPPER-PHOSPHOROUS ALLOY AND A METHOD OF MANUFACTURING CONDUCTIVE STRUCTURE

BACKGROUND

The integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency. However, such scaling down process has also increased the complexity of processing and fabricating ICs. For these advances to be realized, improvements in IC processing and manufacturing are entailed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6D' is a partially enlarged fragmentary diagrammatic view of a portion A of the multilayer wiring structure of FIG. 6D, in accordance with some embodiments of the present disclosure.

FIG. 6D" is a partially enlarged fragmentary diagrammatic view of a portion A of the multilayer wiring structure of FIG. 6D, in accordance with some embodiments of the present disclosure.

FIG. 7A to FIG. 7H are cross sections of the multilayer wiring structure of FIG. 6D" during intermediate stages of manufacturing operations, in accordance with some embodiments of the present disclosure.

DETAILED DESCRIPTION

Figure 1:
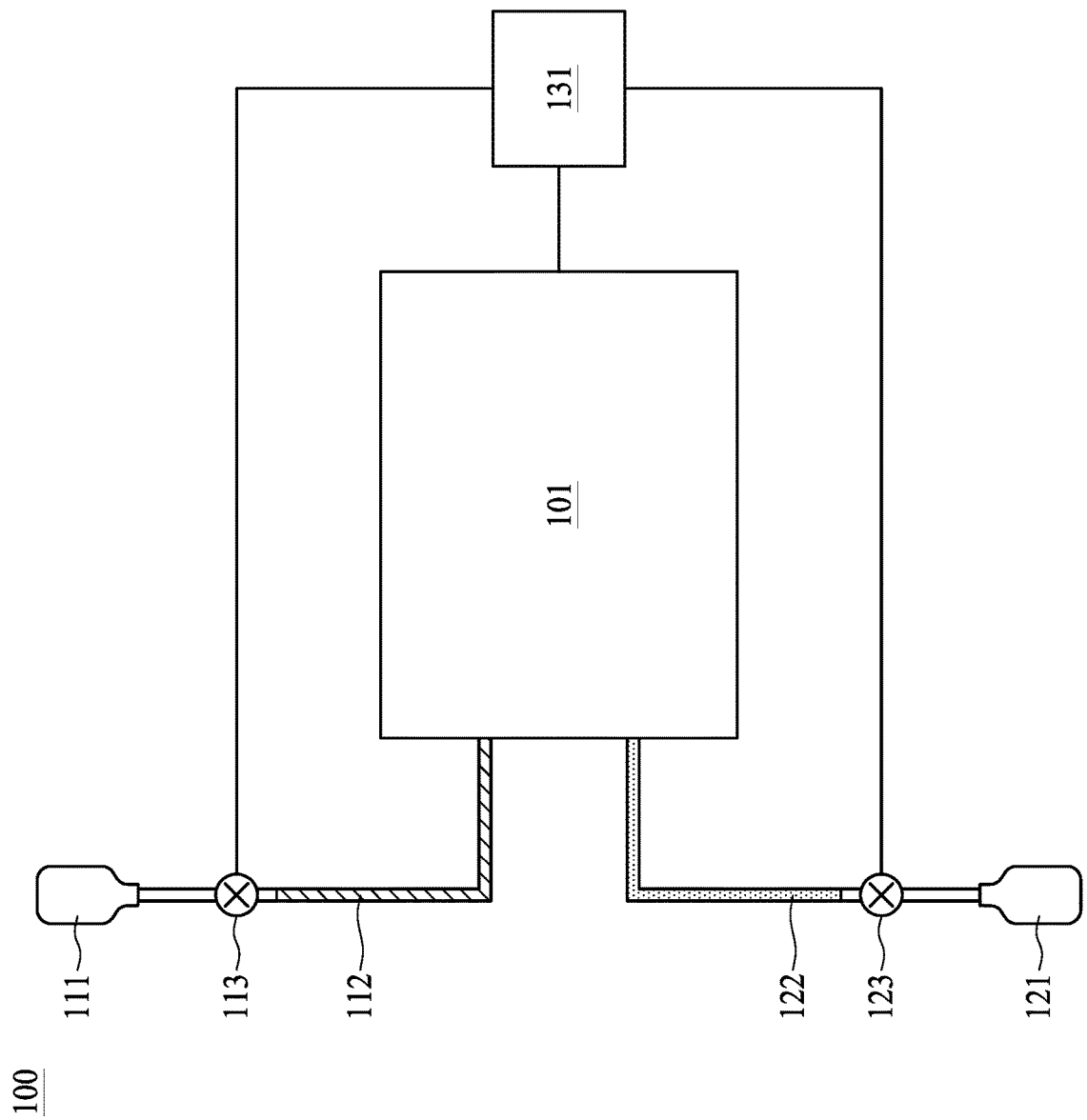
FIG. 1 is a schematic view showing an electroless plating system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Copper sputtering is often utilized in conventional approach for fabricating semiconductor device or printed circuit board (PCB), however, such approach often faces the issue of causing defects in advanced technology node. For example, especially when fabricating a high aspect ratio via, the deposited material may stuck at an opening of a recess, thereby forming voids in the via and causing reliability issues.

Present disclosure provides semiconductor devices, integrated circuit carriers and printed circuit boards (PCB) utilizing copper-phosphorous alloy, such as copper(I) phosphide ($Cu_3P$) to address the issues discussed above. The copper(I) phosphide ($Cu_3P$) in the present disclosure may include the nonstoichiometric compounds $Cu_{3-x}P$, where in some embodiments, x can be less than 0.1 to become copper-deficient $Cu_3P$. In other words, the phosphorous constituent in the copper(I) phosphide can be in a range of from about 13.98% to about 14.39%. Present disclosure also provides novel structures of semiconductor device and printed circuit board (PCB) to facilitate device performance, such as decreasing resistance and improving reliability. Present disclosure also provides method of manufacturing semiconductor device, integrated circuit carrier, and printed circuit board (PCB), wherein the method for forming copper-phosphorous alloy can be nicely compatible thereto.

Comparing to sputtered copper in comparative embodiment, copper-phosphorous alloy may exhibit improved ability regarding anti-corrosive, wear resistance, wettability, more condensed structure, strength, toughness, conformability, processability, et cetera. Particularly, the copper-phosphorous alloy exhibits improved strength and toughness, thus can be utilized as a barrier layer for spacing copper layer away from low-k material or insulator in various direction (such as laterally or vertically) and thereby alleviating the issue related to electron migration effect. Such properties make copper-phosphorous alloy a great candidate that can be incorporated into damascene, dual damascene procedures, or other suitable operations for forming an interconnect structures. Furthermore, the structure and adhesive force of copper-phosphorous alloy alleviates the peeling issue of copper layer when performing a chemical mechanical planarization operation during a damascene, dual damascene operation, or other fabrication operation for forming multi-layer interconnect structure. Also, copper-phosphorous alloy (such as $Cu_3P$) can be formed over the planarized copper surface as a capping layer to prevent copper diffusion toward overlying interlayer dielectric layers. In comparative embodiments of conventional techniques, fabricating copper-phosphorous alloy requires high-temperature annealing. For example, elevating copper and phosphorous to a temperature in a range from about 900° C. to about 1000° C. However, such operation may not be compatible to fabrication operations of IC, PCB, IC carrier since performance of some devices may be decreased due to high-temperature annealing. In contrast, the electroless plating operation or electroplating operation discussed in present disclosure can be performed at a lower temperature (such as below 60° C.), thereby avoiding the issue caused by high temperature annealing. Phosphorous can be utilized as deoxidizer and wetting agent for copper. For example, by forming a thin copper-phosphorous alloy (such as $Cu_3P$) prior to forming copper by plating, the oxidation of the copper layer proximal to a surface of the device (such as printed circuit board, integrated circuit, integrated circuit carrier, or the like) due to the exposure to environment may be alleviated. Particularly, oxygen in the environment reacting with copper may generate copper oxide, thereby causing the issue of increased resistance. In conventional technique, nitrogen is required during the formation of sputtered copper layer to alleviate oxidation, which may incur greater cost. Especially in advanced technology application (such as 5th generation mobile networks, 6th generation mobile networks, artificial intelligence, or the like), the issue of resistance is even more important due to skin depth effect, that is, electrons may accumulate at the surface of conductive wirings (especially when transmitting a high-frequency signal), thereby increasing resistance and deteriorating device performance. In the cases that the copper oxide is formed at surfaces of wirings, the performance of the device may further decrease. In addition, the electrical conductivity and the thermal conductivity for some of the copper-phosphorous alloy is comparative to sputtered copper, which has a resistivity around only 1.84 µΩ·cm and a thermal conductivity around 381 W/(m·K). Furthermore, the advantage regarding the reliability of copper-phosphorous alloy comparing to sputtered copper especially exhibits in extreme ambient environment, such as under non-oxidative acid (HCl, $H_2SO_4$, et cetera), basic solution, organic acid (e.g. acetic acid, citric acid), ocean water, salt solution, or when exposed to air.

Additionally, since copper-phosphorous alloy (such as $Cu_3P$) has a dense structure, it can be utilized as diffusion barrier layer for alleviating the diffusion of copper from conductive wiring into the underlying structures (such as silicon oxide that can be utilized as insulating layer). Therefore, copper-phosphorous alloy (such as $Cu_3P$) can also be utilized as a wetting layer for electro or electroless plating a copper layer, which can alleviate void issues and facilitate the conformability of copper layer in a high aspect ratio via (such as conductive via, blind via, buried via, or the like), especially when forming the copper layer in an electroplating operation. Accordingly, the copper-phosphorous alloy (such as $Cu_3P$ with a thickness in a range from about 1 µm to about 3 µm) may replace sputtered copper wetting layer in some applications of printed circuit board, integrated circuit, integrated circuit carrier, or the like. In some embodiments, when a concentration of phosphorous in a solution is greater than specific level, phosphorous in acicular crystal form may be formed, thus is suitable for catalyzing and facilitating the formation of copper. Furthermore, copper-phosphorous alloy (such as $Cu_3P$, or alloy that comprises $Cu_3P$) can also be utilized as heat dissipation material. Comparing to cobalt (Co) and ruthenium (Ru), the copper-phosphorous alloy in the present disclosure provides improved compatibility with copper. Specifically, a rough film with lower conductivity may form between sputtered copper and cobalt, and Galvanic Corrosion may occur at an interface between copper and cobalt, thereby causing the material loss of cobalt. In the case of ruthenium, ruthenium lacks conformability and wettability, comparing to the copper-phosphorous alloy as discussed in present disclosure.

The aforesaid advantage of copper-phosphorous alloy (especially $Cu_3P$) provides better overall device performance and such high compatibility in semiconductor device, IC and PCB fabrication operation may allow more potential for altering configuration of conductive structures that can further enhance device properties. In some cases, the lack of conformability and processability of sputtered copper limits the potential of increasing aspect ratio of conductive via and changing the configuration of conductive features to reduce resistance. The present disclosure utilizes plating operation for forming wetting material to enhance conformability and processability to address issues related to aspect ratio and resistance. For example, copper-phosphorous alloy (especially $Cu_3P$) or other suitable material (such as copper) can be formed by electroplating operation or electroless plating operation to be a wetting material. In addition, present disclosure provides methods for incorporating copper-phosphorous alloy into the steps of fabricating semiconductor device, IC and PCB, which may include electroless plating operation and/or electroplating operation.

In some embodiments, a copper-phosphorous film (which may include $Cu_3P$) or a copper film can be formed by techniques of electroless plating or electroplating. Electroless plating (also can be referred to as chemical plating or autocatalytic plating) is a type of technique that creates metal or metal-containing alloy coatings on various materials by autocatalytic chemical reduction of metal cations in a liquid bath, wherein a workpiece to be plated is immersed in a reducing agent that, when catalyzed by certain materials, changes metal ions to metal that forms a coating on the workpiece. Generally, advantages of electroless plating technique include compatibility and product quality. In some cases, electroless plating technique can be applied to both conductive workpiece and non-conductive workpiece, and also the workpiece with smaller size or smaller surface area. Furthermore, the coating layer formed by electroless plating technique may exhibit greater anti-corrosive and/or greater wear resistance comparing to electroplating technique.

In contrast, electroplating is a technique for forming metal coatings on various materials by externally generated electric current. Advantages of the electroplating technique include higher efficiency and greater throughput.

Referring to FIG. 1, FIG. 1 is a schematic view showing an electroless plating system, in accordance with some embodiments of the present disclosure. The electroless plating system 100 includes a processing chamber 101, a phosphorus-based chemical source 111, and a copper-based chemical source 121. The phosphorus-based chemical source 111 is configured to supply a phosphorus-based chemical to a plating solution of the processing chamber 101 via the first conduit 112, and a copper-based chemical source 121 is configured to supply copper-based chemical to the plating solution of the processing chamber 101 via the second conduit 122. Herein the phosphorus-based chemical and the copper-based chemical may be in liquid phase or gaseous phase. In some embodiments, the first conduit 112 and the second conduit 122 may be made of a material that is not substantially reactive to the phosphorus-based chemical or the copper-based chemical, for example, Polytetrafluoroethylene (PTFE), vinyl polymers, polypropylene (PP), polyvinyl chloride (PVC), polyvinylidene difluoride (PVDF), stainless steel, or other suitable materials that can be utilized as pipe. In some embodiments, during an electroless plating operation, a workpiece to be plated can be disposed in the plating solution of the processing chamber 101. In some embodiments, the chemical reaction occurred in the processing chamber 101 depends on a composition of the plating solution as well as the operation condition of the plating solution. Particularly, a resultant of the electroless plating may be associated with a concentration phosphorus-based chemical in the plating solution. Accordingly, in some embodiments, the electroless plating system 100 further includes a first mass flow controller 113 attached to the first conduit 112 and a second mass flow controller 123 attached to the second conduit 122, such that the supply of the phosphorus-based chemical and the copper-based chemical to the processing chamber 101 can be respectively adjusted. In some embodiments, the electroless plating system 100 further includes a controller 131 for controlling a condition of the processing chamber 101, for example, adjusting a temperature of the plating solution. The controller 131 may include heater and/or cooler. In some embodiments, the controller 131 may further include one or more sensors for obtaining a status of the plating solution, such as a composition of the plating solution, for the purpose of further adjusting the status of the plating solution.

In some embodiments, the phosphorus-based chemical can be one of the following chemicals: phosphine ($PH_3$), phosphoryl chloride ($POCl_3$), or phosphorus trichloride ($PCl_3$). In some embodiments, the copper-based chemical can be one of the following chemicals: copper(II) sulfate ($CuSO_4$), or copper(II) pyrophosphate ($Cu_2P_2O_7$). In some embodiments, under certain condition $PH_3$ (either in liquid phase or gaseous phase) may further migrate to a position proximal to a bottom of a conductive via, and generate hydrogen ion ($H^+$), which can react with copper oxide (often formed at a copper surface that exposed to oxygen) and generate water vapor that can dissipate away. Such property can improve the purity of copper in a conductive via. In some alternative embodiments, copper(II) phosphate ($Cu_3(PO_4)_2$) can also be utilized as copper-based chemical. In some embodiments, the plating solution is substantially free of cyanide. In some embodiments, the solution of copper(II) phosphate ($Cu_3(PO_4)_2$) and the solution of copper(II) pyrophosphate ($Cu_2P_2O_7$) may be basic solution, which may exhibit a pH value greater than 7. In some cases, utilizing basic chemicals during fabrication operations may alleviate the issue of material loss, especially the barrier layers, tantalum nitride layer (TaN), or cobalt layers in the workpiece. For example, tantalum oxide may be formed when tantalum nitride is oxidized, which may further cause reliability issues.

The plating solution includes soluble salt that provide metallic ions (such as $Cu^{2+}$) for the electroless plating operation. In some embodiments, the plating solution further includes complexation reagent, which can bond with the aforesaid metallic ions (such as $Cu^{2+}$) thereby forming a coordination complex. In some embodiments, the plating solution further includes buffering agent, which can be utilized to adjust or stabilize the pH value (i.e. acidity/basicity) of the plating solution. In some embodiments, the plating solution further includes active agent such as chloride ion ($Cl^-$), where chloride ion can also be utilized as anode surfactant. In some embodiments, the plating solution further includes other additives, such as brightener that includes chloride ion ($Cl^-$), grain refiner, leveling agent, wetting agent, stress relieving agent, or inhibitor. For example, the polyethylene glycol (PEG) may react with metallic ions (or phosphorous ion in some cases) and forming a coordination complex, thereby adjusting a reaction rate of the plating (such as decreasing the reaction rate). Furthermore, PEG can further increase wettability, thus improving the result of forming procedures.

In some of the embodiments, the plating solution further includes reducing agent, thereby turning ions in the plating solution into coating material (e.g. copper (Cu) or copper-phosphorous alloy such as $Cu_3P$).

The electroless plating operation for coating copper over a workpiece can utilize the following plating solution, which include a phosphorus-based chemical and a copper-based chemical. A result of the electroless plating operation may be based on operational conditions regarding concentration of specific chemical and operation temperature.

Embodiment 1 of a plating solution for an electroless plating operation, which includes $CuSO_4 \cdot 5H_2O$ and $PH_3$, can be utilized for forming $Cu_3P$ coating (shown in Table 1-1 and chemical equation 1-1) and Cu coating (shown in Table 1-2 and chemical equation 1-2). Under different operation condition and different composition of the plating solution, the result of plating may be different.

TABLE 1-1

Copper-based chemical: $CuSO_4 \cdot 5H_2O$
Phosphorus-based chemical: $PH_3$
Chemical Equation: $24CuSO_4 + 11PH_3 + 12H_2O \rightarrow 8Cu_3P\downarrow + 3H_3PO_4 + 24H_2SO_4 \ldots$ (1-1)

| Composition of plating solution/ Operation conditions | Range, according to some embodiments |
|---|---|
| Concentration of $CuSO_4 \cdot 5H_2O$ in the plating solution | From about 75 g/L to about 95 g/L |
| Concentration of $PH_3$ in the plating solution | From about 5.3 g/L to about 10.6 g/L |
| Concentration of chloride in the plating solution | From about 50 PPM to about 60 PPM |
| pH value of the plating solution | From about 8 to about 9 |
| Temperature | From about 50° C. to about 60° C. |
| Additive during electroless plating operation | $CuSO_4 \cdot 5H_2O$ |

For example, a plating solution that can be utilized for forming $Cu_3P$ coating may include $CuSO_4 \cdot 5H_2O$ with a concentration of 85 g/L, $PH_3$ with a concentration of 6.89 g/L, and chloride (which may include additional additive as discussed above) with a concentration about 55 PPM. A pH value of the plating solution may be about 8.7, a temperature of the plating solution may be about 55° C., and the copper-based chemical ($CuSO_4 \cdot 5H_2O$) can be supplied in the plating solution during an electroless plating operation in order to sustain the concentration thereof.

TABLE 1-2

Copper-based chemical: $CuSO_4 \cdot 5H_2O$
Phosphorus-based chemical: $PH_3$
Chemical Equation: $4CuSO_4 + PH_3 + 4H_2O \rightarrow 4Cu\downarrow + H_3PO_4 + 4H_2SO_4 \ldots$ (1-2)

| Composition of plating solution/ Operation conditions | Range, according to some embodiments |
|---|---|
| Concentration of $CuSO_4 \cdot 5H_2O$ in the plating solution | From about 75 g/L to about 95 g/L |
| Concentration of $PH_3$ in the plating solution | From about 1.734 g/L to about 2.89 g/L |
| Concentration of chloride in the plating solution | From about 50 PPM to about 60 PPM |
| pH value of the plating solution | From about 8 to about 9 |
| Temperature | From about 20° C. to about 30° C. |
| Additive during electroless plating operation | $CuSO_4 \cdot 5H_2O$ |

For example, a plating solution that can be utilized for forming Cu coating may include $CuSO_4 \cdot 5H_2O$ with a concentration of 85 g/L, $PH_3$ with a concentration of 2.312 g/L, and chloride (which may include additional additive as discussed above) with a concentration about 55 PPM. A pH value of the plating solution may be about 8.7, a temperature of the plating solution may be about 25° C., and the copper-based chemical ($CuSO_4 \cdot 5H_2O$) can be supplied in the plating solution during an electroless plating operation in order to sustain the concentration and electrical characteristic thereof.

Referring to Table 1-1 and Table 1-2, in some embodiments, a concentration of $PH_3$ in the plating solution for forming $Cu_3P$ coating is greater than a concentration of $PH_3$ in the plating solution for forming Cu coating. In some embodiments, an operation temperature of the plating solution for forming $Cu_3P$ coating is greater than an operation temperature of the plating solution for forming Cu coating. Since a temperature and a composition of the plating solution including $CuSO_4 \cdot 5H_2O$ and $PH_3$ may have influence on the type of reaction that will be triggered, the temperature and the composition of the plating solution can be controlled in order to obtain desirable result.

For example, in order to form a $Cu_3P$ layer (which can be a wetting layer and deoxidization layer) over a workpiece, the controller 131 (shown in FIG. 1) controls a temperature of the plating solution to be in a range from about 50° C. to about 60° C., and the first mass flow controller 113 as well as the second mass flow controller 123 may control the inflow of the phosphorus-based chemical and the copper-based chemical, thereby controlling a concentration of the $PH_3$ in the plating solution to be in a range from about 5.3 g/L to about 10.6 g/L. The first mass flow controller 113 as well as the second mass flow controller 123 may also control a concentration of $CuSO_4 \cdot 5H_2O$ in the plating solution. In the cases that a Cu layer is subsequently formed, the controller 131 can control a temperature of the plating solution to be in a range from about 20° C. to about 30° C., and the first mass flow controller 113 as well as the second mass flow controller 123 may control a composition of the plating solution such that the concentration of the $PH_3$ in the plating solution can be in a range from about 1.734 g/L to about 2.89 g/L.

It should be noted that there may be other variables that may influence a result of the product in electroless plating operation, therefore, the aforesaid ranges may be adjusted accordingly. Further, the aforesaid supply and control mechanism can also be applied to the following embodiments of plating solution. For the purpose of conciseness, redundant descriptions would not be repeated.

A plating solution for an electroless plating operation described in Embodiment 2 includes $CuSO_4 \cdot 5H_2O$ and phosphoryl chloride ($POCl_3$). The plating solution can be utilized for forming $Cu_3P$ coating (shown in Table 2-1 and chemical equation 2-1) and Cu coating (shown in Table 2-2 and chemical equation 2-2). Alternatively stated, under different operation condition and different composition of the plating solution, the result of plating may be different.

TABLE 2-1

Copper-based chemical: $CuSO_4 \cdot 5H_2O$
Phosphorus-based chemical: $POCl_3$
Chemical Equation: $12CuSO_4 + 8POCl_3 + 30H_2O \rightarrow 4Cu_3P\downarrow + 4H_3PO_4 + 12H_2SO_4 + 24HCl + 11O_2$ (2-1)

| Composition of plating solution/ Operation conditions | Range, according to some embodiments |
|---|---|
| Concentration of $CuSO_4 \cdot 5H_2O$ in the plating solution | From about 75 g/L to about 95 g/L |
| Concentration of $POCl_3$ in the plating solution | From about 34.755 g/L to about 69.51 g/L |
| Concentration of chloride in the plating solution | From about 50 PPM to about 60 PPM |
| pH value of the plating solution | From about 8 to about 9 |
| Temperature | From about 50° C. to about 60° C. |
| Additive during electroless plating operation | $CuSO_4 \cdot 5H_2O$ |

For example, a plating solution that can be utilized for forming $Cu_3P$ coating may include $CuSO_4 \cdot 5H_2O$ with a concentration of 85 g/L, $POCl_3$ with a concentration of 45.182 g/L, and chloride (which may include additional additive as discussed above) with a concentration about 55 PPM. A pH value of the plating solution may be about 8.7, a temperature of the plating solution may be about 55° C., and the copper-based chemical ($CuSO_4 \cdot 5H_2O$) can be supplied in the plating solution during an electroless plating operation in order to sustain the concentration thereof.

TABLE 2-2

Copper-based chemical: $CuSO_4 \bullet 5H_2O$
Phosphorus-based chemical: $POCl_3$
Chemical Equation: $3CuSO_4 + 2POCl_3 + 6H_2O \rightarrow 3Cu\downarrow + 2H_3PO_4 + 3H_2SO_4 + 3Cl_2 \ldots$ (2-2)

| Composition of plating solution/ Operation conditions | Range, according to some embodiments |
|---|---|
| Concentration of $CuSO_4 \bullet 5H_2O$ in the plating solution | From about 75 g/L to about 95 g/L |
| Concentration of $POCl_3$ in the plating solution | From about 20.853 g/L to about 34.755 g/L |
| Concentration of chloride in the plating solution | From about 50 PPM to about 60 PPM |
| pH value of the plating solution | From about 8 to about 9 |
| Temperature | From about 20° C. to about 30° C. |
| Additive during electroless plating operation | $CuSO_4 \bullet 5H_2O$ |

For example, a plating solution that can be utilized for forming Cu coating may include $CuSO_4 \cdot 5H_2O$ with a concentration of 85 g/L, $POCl_3$ with a concentration of 34.755 g/L, and chloride (which may include additional additive as discussed above) with a concentration about 55 PPM. A pH value of the plating solution may be about 8.7, a temperature of the plating solution may be about 25° C., and the copper-based chemical ($CuSO_4 \cdot 5H_2O$) can be supplied in the plating solution during an electroless plating operation in order to sustain the concentration and electrical characteristic thereof.

Referring to Table 2-1 and Table 2-2, in some embodiments, a concentration of $POCl_3$ in the plating solution for forming $Cu_3P$ coating is greater than a concentration of $POCl_3$ in the plating solution for forming Cu coating. In some embodiments, an operation temperature of the plating solution for forming $Cu_3P$ coating is greater than an operation temperature of the plating solution for forming Cu coating. Since a temperature and a composition of the plating solution including $CuSO_4 \cdot 5H_2O$ and $POCl_3$ may have influence on the type of reaction that will be triggered, the temperature and the composition of the plating solution can be respectively controlled by the controller 131 and the first mass flow controller 113/the second mass flow controller 123 in order to obtain desirable result.

In some embodiments, hydrochloric acid (HCl) may be generated during electroless plating operation for forming $Cu_3P$ coating when utilizing a plating solution that includes $CuSO_4 \cdot 5H_2O$ and $POCl_3$ (as shown in chemical equation 2-1). The hydrochloric acid (HCl) may act as an activator for a surface of the workpiece, thereby improving a shininess and the reliability of the $Cu_3P$ coating.

In some embodiments, chlorine ($Cl_2$) may be generated during electroless plating operation for forming Cu coating when utilizing a plating solution that includes $CuSO_4 \cdot 5H_2O$ and $POCl_3$ (as shown in chemical equation 2-2). The chlorine ($Cl_2$) may act as an activator for a surface of the workpiece, thereby improving a shininess and the reliability of the Cu coating.

A plating solution for an electroless plating operation described in Embodiment 3 includes $CuSO_4 \cdot 5H_2O$ and phosphorous trichloride ($PCl_3$). The plating solution can be utilized for forming $Cu_3P$ coating (shown in Table 3-1 and chemical equation 3-1) and Cu coating (shown in Table 3-2 and chemical equation 3-2). Alternatively stated, under different operation condition and different composition of the plating solution, the result of plating may be different.

TABLE 3-1

Copper-based chemical: $CuSO_4 \bullet 5H_2O$
Phosphorus-based chemical: $PCl_3$
Chemical Equation: $6 CuSO_4 + 6 PCl_3 + 16 H_2O \rightarrow 2Cu_3P\downarrow + 4 H_3PO_4 + 6 H_2SO_4 + 8 HCl + 5 Cl_2 \ldots$ (3-1)

| Composition of plating solution/ Operation conditions | Range, according to some embodiments |
|---|---|
| Concentration of $CuSO_4 \bullet 5H_2O$ in the plating solution | From about 75 g/L to about 95 g/L |
| Concentration of $PCl_3$ in the plating solution | From about 46.693 g/L to about 93.386 g/L |
| Concentration of chloride in the plating solution | From about 50 PPM to about 60 PPM |
| pH value of the plating solution | From about 8 to about 9 |
| Temperature | From about 50° C. to about 60° C. |
| Additive during electroless plating operation | $CuSO_4 \bullet 5H_2O$ |

For example, a plating solution that can be utilized for forming $Cu_3P$ coating may include $CuSO_4 \cdot 5H_2O$ with a concentration of 85 g/L, $PCl_3$ with a concentration of 60.7 g/L, and chloride (which may include additional additive as discussed above) with a concentration about 55 PPM. A pH value of the plating solution may be about 8.7, a temperature of the plating solution may be about 55° C., and the copper-based chemical ($CuSO_4 \cdot 5H_2O$) can be supplied in the plating solution during an electroless plating operation in order to sustain the concentration thereof.

TABLE 3-2

Copper-based chemical: $CuSO_4 \bullet 5H_2O$
Phosphorus-based chemical: $PCl_3$
Chemical Equation: $CuSO_4 + PCl_3 + 4H_2O \rightarrow Cu\downarrow + H_3PO_4 + H_2SO_4 + 3 HCl \ldots$ (3-2)

| Composition of plating solution/ Operation conditions | Range, according to some embodiments |
|---|---|
| Concentration of $CuSO_4 \bullet 5H_2O$ in the plating solution | From about 75 g/L to about 95 g/L |
| Concentration of $PCl_3$ in the plating solution | From about 28.015 g/L to about 46.693 g/L |
| Concentration of chloride in the plating solution | From about 50 PPM to about 60 PPM |
| pH value of the plating solution | From about 8 to about 9 |
| Temperature | From about 20° C. to about 30° C. |
| Additive during electroless plating operation | $CuSO_4 \bullet 5H_2O$ |

For example, a plating solution that can be utilized for forming Cu coating may include $CuSO_4 \cdot 5H_2O$ with a concentration of 85 g/L, $PCl_3$ with a concentration of 37.354 g/L, and chloride (which may include additional additive as discussed above) with a concentration about 55 PPM. A pH value of the plating solution may be about 8.7, a temperature of the plating solution may be about 25° C., and the copper-based chemical ($CuSO_4 \cdot 5H_2O$) can be supplied in the plating solution during an electroless plating operation in order to sustain the concentration and electrical characteristic thereof.

Referring to Table 3-1 and Table 3-2, in some embodiments, a concentration of $PCl_3$ in the plating solution for forming $Cu_3P$ coating is greater than a concentration of $PCl_3$ in the plating solution for forming Cu coating. In some embodiments, an operation temperature of the plating solution for forming $Cu_3P$ coating is greater than an operation temperature of the plating solution for forming Cu coating. Since a temperature and a composition of the plating solution including $CuSO_4 \cdot 5H_2O$ and $PCl_3$ may have influence on the type of reaction that will be triggered, the temperature and the composition of the plating solution can be respectively controlled by the controller 131 and the first mass flow controller 113/the second mass flow controller 123 in order to obtain desirable result.

In some embodiments, hydrochloric acid (HCl), and chlorine ($Cl_2$) in some cases, may be generated during electroless plating operation for forming $Cu_3P$ coating and Cu coating when utilizing a plating solution that includes $CuSO_4 \cdot 5H_2O$ and $PCl_3$ (as shown in chemical equation 3-1 and 3-2). In some embodiments, chloride ions can be utilized as anode active agent, thereby improving a shininess and the reliability of the $Cu_3P$ coating and the Cu coating.

A plating solution for an electroless plating operation described in Embodiment 4 includes $Cu_2P_2O_7 \cdot 3H_2O$ and gaseous $PH_3$. The plating solution can be utilized for forming $Cu_3P$ coating (shown in Table 4-1 and chemical equation 4-1) and Cu coating (shown in Table 4-2 and chemical equation 4-2). Alternatively stated, under different operation condition and different composition of the plating solution, the result of plating may be different.

TABLE 4-1

Copper-based chemical: $Cu_2P_2O_7 \cdot 3H_2O$
Phosphorus-based chemical: $PH_3$
Chemical Equation: $3Cu_2P_2O7 + 3PH_3 + 7H_2O \rightarrow$
$2Cu_3P\downarrow + 7H_3PO_4 + 2H_2 \ldots$ (4-1)

| Composition of plating solution/ Operation conditions | Range, according to some embodiments |
|---|---|
| Concentration of $Cu_2P_2O_7 \cdot 3H_2O$ in the plating solution | From about 75 g/L to about 95 g/L |
| Concentration of $K_4P_2O_7$ in the plating solution | From about 250 g/L to about 350 g/L |
| Concentration of $PH_3$ (gaseous) in the plating solution | From about 9.6 g/L to about 19.2 g/L |
| Concentration of ammonium hydroxide solution (e.g. 28% ammonia solution) in the plating solution | From about 2 mL/L to about 4 mL/L |
| pH value of the plating solution | From about 8 to about 9 |
| Temperature | From about 50° C. to about 60° C. |

For example, a plating solution that can be utilized for forming $Cu_3P$ coating may include $Cu_2P_2O_7 \cdot 3H_2O$ with a concentration of 85 g/L, $K_4P_2O_7$ with a concentration of 310 g/L, $PH_3$ with a concentration of 12.48 g/L, and ammonium hydroxide solution (e.g. 28% ammonia solution) with a concentration about 3 mL/L. A pH value of the plating solution may be about 8.7, a temperature of the plating solution may be about 57° C. $K_4P_2O_7$ can provide phosphate ions in the plating solution, which can improve complexing ability and buffer the variation of pH value of the plating solution, thereby stabilizing the pH value of plating solution.

TABLE 4-2

Copper-based chemical: $Cu_2P_2O_7 \cdot 3H_2O$
Phosphorus-based chemical: $PH_3$
Chemical Equation: $Cu_2P_2O_7 + PH_3 + 5H_2O \rightarrow$
$2Cu\downarrow + 3 H_3PO_4 + 2H_2$ (4-2)

| Composition of plating solution/ Operation conditions | Range, according to some embodiments |
|---|---|
| Concentration of $Cu_2P_2O_7 \cdot 3H_2O$ in the plating solution | From about 75 g/L to about 95 g/L |

TABLE 4-2-continued

Copper-based chemical: $Cu_2P_2O_7 \cdot 3H_2O$
Phosphorus-based chemical: $PH_3$
Chemical Equation: $Cu_2P_2O_7 + PH_3 + 5H_2O \rightarrow$
$2Cu\downarrow + 3 H_3PO_4 + 2H_2$ (4-2)

| Composition of plating solution/ Operation conditions | Range, according to some embodiments |
|---|---|
| Concentration of $K_4P_2O_7$ in the plating solution | From about 250 g/L to about 350 g/L |
| Concentration of $PH_3$ (gaseous) in the plating solution | From about 9.6 g/L to about 19.2 g/L |
| Concentration of ammonium hydroxide solution (e.g. 28% ammonia solution) in the plating solution | From about 2 mL/L to about 4 mL/L |
| pH value of the plating solution | From about 8 to about 9 |
| Temperature | From about 20° C. to about 30° C. |

For example, a plating solution that can be utilized for forming Cu coating may include $Cu_2P_2O_7 \cdot 3H_2O$ with a concentration of 85 g/L, $K_4P_2O_7$ with a concentration of 310 g/L, $PH_3$ with a concentration of 5.76 g/L, and ammonium hydroxide solution (e.g. 28% ammonia solution) with a concentration about 3 mL/L. A pH value of the plating solution may be about 8.7, a temperature of the plating solution may be about 27° C. $K_4P_2O_7$ can provide phosphate ions in the plating solution, which can improve complexing ability and buffer the variation of pH value of the plating solution, thereby stabilizing the pH value of plating solution.

Referring to Table 4-1 and Table 4-2, in some embodiments, a concentration of $PH_3$ in the plating solution for forming $Cu_3P$ coating is greater than a concentration of $PH_3$ in the plating solution for forming Cu coating. In some embodiments, an operation temperature of the plating solution for forming $Cu_3P$ coating is greater than an operation temperature of the plating solution for forming Cu coating. Since a temperature and a composition of the plating solution including $Cu_2P_2O_7 \cdot 3H_2O$ and $PH_3$ may have influence on the type of reaction that will be triggered, the temperature and the composition of the plating solution can be respectively controlled by the controller 131 and the first mass flow controller 113/the second mass flow controller 123 in order to obtain desirable result.

In some embodiments, hydrogen ($H_2$) may be generated during electroless plating operation for forming $Cu_3P$ coating and Cu coating when utilizing a plating solution that includes $Cu_2P_2O_7 \cdot 3H_2O$ and $PH_3$ (as shown in chemical equation 4-1 and 4-2). In some embodiments, hydrogen can alleviate the oxidation of copper since hydrogen may react with oxide ion, thereby improving the quality and reliability of coating operation as well as the product thereof.

A plating solution for an electroless plating operation described in Embodiment 5 includes $Cu_2P_2O_7 \cdot 3H_2O$ and gaseous $POCl_3$. The plating solution can be utilized for forming $Cu_3P$ coating (shown in Table 5-1 and chemical equation 5-1) and Cu coating (shown in Table 5-2 and chemical equation 5-2). Alternatively stated, under different operation condition and different composition of the plating solution, the result of plating may be different.

TABLE 5-1

Copper-based chemical: $Cu_2P_2O_7 \cdot 3H_2O$
Phosphorus-based chemical: $POCl_3$
Chemical Equation: $6Cu_2P_2O_7 + 14\ POCl_3 + 34H_2O \rightarrow 4Cu_3P\downarrow + 22H_3PO_4 + 2HCl + 20Cl_2 + O_2 \ldots$ (5-1)

| Composition of plating solution/ Operation conditions | Range, according to some embodiments |
|---|---|
| Concentration of $Cu_2P_2O_7 \cdot 3H_2O$ in the plating solution | From about 75 g/L to about 95 g/L |
| Concentration of $K_4P_2O_7$ in the plating solution | From about 250 g/L to about 350 g/L |
| Concentration of $POCl_3$ (liquid) in the plating solution | From about 101.02 g/L to about 202.04 g/L |
| Concentration of ammonium hydroxide solution (e.g. 28% ammonia solution) in the plating solution | From about 2 mL/L to about 4 mL/L |
| pH value of the plating solution | From about 8 to about 9 |
| Temperature | From about 50° C. to about 60° C. |

For example, a plating solution that can be utilized for forming $Cu_3P$ coating may include $Cu_2P_2O_7 \cdot 3H_2O$ with a concentration of 85 g/L, $K_4P_2O_7$ with a concentration of 310 g/L, $POCl_3$ with a concentration of 131.326 g/L, and ammonium hydroxide solution (e.g. 28% ammonia solution) with a concentration about 3 mL/L. A pH value of the plating solution may be about 8.7, and a temperature of the plating solution may be about 57° C. $K_4P_2O_7$ can provide phosphate ions in the plating solution, which can improve complexing ability and buffer the variation of pH value of the plating solution, thereby stabilizing the pH value of plating solution.

TABLE 5-2

Copper-based chemical: $Cu_2P_2O_7 \cdot 3H_2O$
Phosphorus-based chemical: $POCl_3$
Chemical Equation: $Cu_2P_2O_7 + POCl_3 + 6H_2O \rightarrow 2Cu\downarrow + 3\ H_3PO_4 + 3HCl + O_2 \ldots$ (5-2)

| Composition of plating solution/ Operation conditions | Range, according to some embodiments |
|---|---|
| Concentration of $Cu_2P_2O_7 \cdot 3H_2O$ in the plating solution | From about 75 g/L to about 95 g/L |
| Concentration of $K_4P_2O_7$ in the plating solution | From about 250 g/L to about 350 g/L |
| Concentration of $POCl_3$ (liquid) in the plating solution | From about 28.015 g/L to about 46.693 g/L |
| Concentration of ammonium hydroxide solution (e.g. 28% ammonia solution) in the plating solution | From about 2 mL/L to about 4 mL/L |
| pH value of the plating solution | From about 8 to about 9 |
| Temperature | From about 20° C. to about 30° C. |

For example, a plating solution that can be utilized for forming Cu coating may include $Cu_2P_2O_7 \cdot 3H_2O$ with a concentration of 85 g/L, $K_4P_2O_7$ with a concentration of 310 g/L, $POCl_3$ with a concentration of 37.354 g/L, and ammonium hydroxide solution (e.g. 28% ammonia solution) with a concentration about 3 mL/L. A pH value of the plating solution may be about 8.7, a temperature of the plating solution may be about 27° C. $K_4P_2O_7$ can provide phosphate ions in the plating solution, which can improve complexing ability and buffer the variation of pH value of the plating solution, thereby stabilizing the pH value of plating solution.

Referring to Table 5-1 and Table 5-2, in some embodiments, a concentration of $POCl_3$ in the plating solution for forming $Cu_3P$ coating is greater than a concentration of $POCl_3$ in the plating solution for forming Cu coating. In some embodiments, an operation temperature of the plating solution for forming $Cu_3P$ coating is greater than an operation temperature of the plating solution for forming Cu coating. Since a temperature and a composition of the plating solution including $Cu_2P_2O_7 \cdot 3H_2O$ and $POCl_3$ may have influence on the type of reaction that will be triggered, the temperature and the composition of the plating solution can be respectively controlled by the controller 131 and the first mass flow controller 113/the second mass flow controller 123 in order to obtain desirable result.

In some embodiments, hydrochloric acid (HCl) and chlorine ($Cl_2$) may be generated during electroless plating operation for forming $Cu_3P$ coating when utilizing a plating solution that includes $Cu_2P_2O_7 \cdot 3H_2O$ and $POCl_3$ (as shown in chemical equation 5-1). The hydrochloric acid (HCl) and chlorine ($Cl_2$) may improve a shininess and the reliability of the $Cu_3P$ coating.

In some embodiments, hydrochloric acid (HCl) may be generated during electroless plating operation for forming Cu coating when utilizing a plating solution that includes $Cu_2P_2O_7 \cdot 3H_2O$ and $POCl_3$ (as shown in chemical equation 5-2). The hydrochloric acid (HCl) may improve a shininess and the reliability of the Cu coating.

A plating solution for an electroless plating operation described in Embodiment 6 includes $Cu_2P_2O_7 \cdot 3H_2O$ and gaseous $PCl_3$. The plating solution can be utilized for forming $Cu_3P$ coating (shown in Table 6-1 and chemical equation 6-1) and Cu coating (shown in Table 6-2 and chemical equation 6-2). Alternatively stated, under different operation condition and different composition of the plating solution, the result of plating may be different.

TABLE 6-1

Copper-based chemical: $Cu_2P_2O_7 \cdot 3H_2O$
Phosphorus-based chemical: $PCl_3$
Chemical Equation: $6Cu_2P_2O_7 + 4\ PCl_3 + 20H_2O \rightarrow 4Cu_3P\downarrow + 12H_3PO_4 + 4HCl + 4Cl_2 + 7O_2 \ldots$ (6-1)

| Composition of plating solution/ Operation conditions | Range, according to some embodiments |
|---|---|
| Concentration of $Cu_2P_2O_7 \cdot 3H_2O$ in the plating solution | From about 75 g/L to about 95 g/L |
| Concentration of $K_4P_2O_7$ in the plating solution | From about 250 g/L to about 350 g/L |
| Concentration of $PCl_3$ (liquid) in the plating solution | From about 25.855 g/L to about 51.71 g/L |
| Concentration of ammonium hydroxide solution (e.g. 28% ammonia solution) in the plating solution | From about 2 mL/L to about 4 mL/L |
| pH value of the plating solution | From about 8 to about 9 |
| Temperature | From about 50° C. to about 60° C. |

For example, a plating solution that can be utilized for forming $Cu_3P$ coating may include $Cu_2P_2O_7 \cdot 3H_2O$ with a concentration of 85 g/L, $K_4P_2O_7$ with a concentration of 310 g/L, $PCl_3$ with a concentration of 33.612 g/L, and ammonium hydroxide solution (e.g. 28% ammonia solution) with a concentration about 3 mL/L. A pH value of the plating solution may be about 8.7, a temperature of the plating solution may be about 57° C. $K_4P_2O_7$ can provide phosphate ions in the plating solution, which can improve complexing ability and buffer the variation of pH value of the plating solution, thereby stabilizing the pH value of plating solution.

TABLE 6-2

Copper-based chemical: $Cu_2P_2O_7 \cdot 3H_2O$
Phosphorus-based chemical: $POCl_3$
Chemical Equation: $Cu_2P_2O_7 + PCl_3 + 5H_2O \rightarrow 2Cu\downarrow + 3\,H_3PO_4 + HCl + Cl_2 \ldots$ (6-2)

| Composition of plating solution/ Operation conditions | Range, according to some embodiments |
|---|---|
| Concentration of $Cu_2P_2O_7 \cdot 3H_2O$ in the plating solution | From about 75 g/L to about 95 g/L |
| Concentration of $K_4P_2O_7$ in the plating solution | From about 250 g/L to about 350 g/L |
| Concentration of $PCl_3$ (liquid) in the plating solution | From about 28.015 g/L to about 46.693 g/L |
| Concentration of ammonium hydroxide solution (e.g. 28% ammonia solution) in the plating solution | From about 2 mL/L to about 4 mL/L |
| pH value of the plating solution | From about 8 to about 9 |
| Temperature | From about 20° C. to about 30° C. |

For example, a plating solution that can be utilized for forming Cu coating may include $Cu_2P_2O_7 \cdot 3H_2O$ with a concentration of 85 g/L, $K_4P_2O_7$ with a concentration of 310 g/L, $PCl_3$ with a concentration of 37.354 g/L, and ammonium hydroxide solution (e.g. 28% ammonia solution) with a concentration about 3 mL/L. A pH value of the plating solution may be about 8.7, a temperature of the plating solution may be about 27° C. $K_4P_2O_7$ can provide phosphate ions in the plating solution, which can improve complexing ability and buffer the variation of pH value of the plating solution, thereby stabilizing the pH value of plating solution.

Referring to Table 6-1 and Table 6-2, in some embodiments, a concentration of $PCl_3$ in the plating solution for forming $Cu_3P$ coating is greater than a concentration of $PCl_3$ in the plating solution for forming Cu coating. In some embodiments, an operation temperature of the plating solution for forming $Cu_3P$ coating is greater than an operation temperature of the plating solution for forming Cu coating. Since a temperature and a composition of the plating solution including $Cu_2P_2O_7 \cdot 3H_2O$ and $PCl_3$ may have influence on the type of reaction that will be triggered, the temperature and the composition of the plating solution can be respectively controlled by the controller 131 and the first mass flow controller 113/the second mass flow controller 123 in order to obtain desirable result.

In some embodiments, hydrochloric acid (HCl) and chlorine ($Cl_2$) may be generated during electroless plating operation for forming $Cu_3P$ coating and Cu coating when utilizing a plating solution that includes $Cu_2P_2O_7 \cdot 3H_2O$ and $PCl_3$ (as shown in chemical equation 6-1 and 6-2). The hydrochloric acid (HCl) and chlorine ($Cl_2$) may improve a shininess and the reliability of the $Cu_3P$ coating and the Cu coating.

It should further be noted that the aforesaid electroless plating can also utilized to form other types of coating with corresponding plating solution, such as for forming cobalt phosphorus coating.

Figure 2:
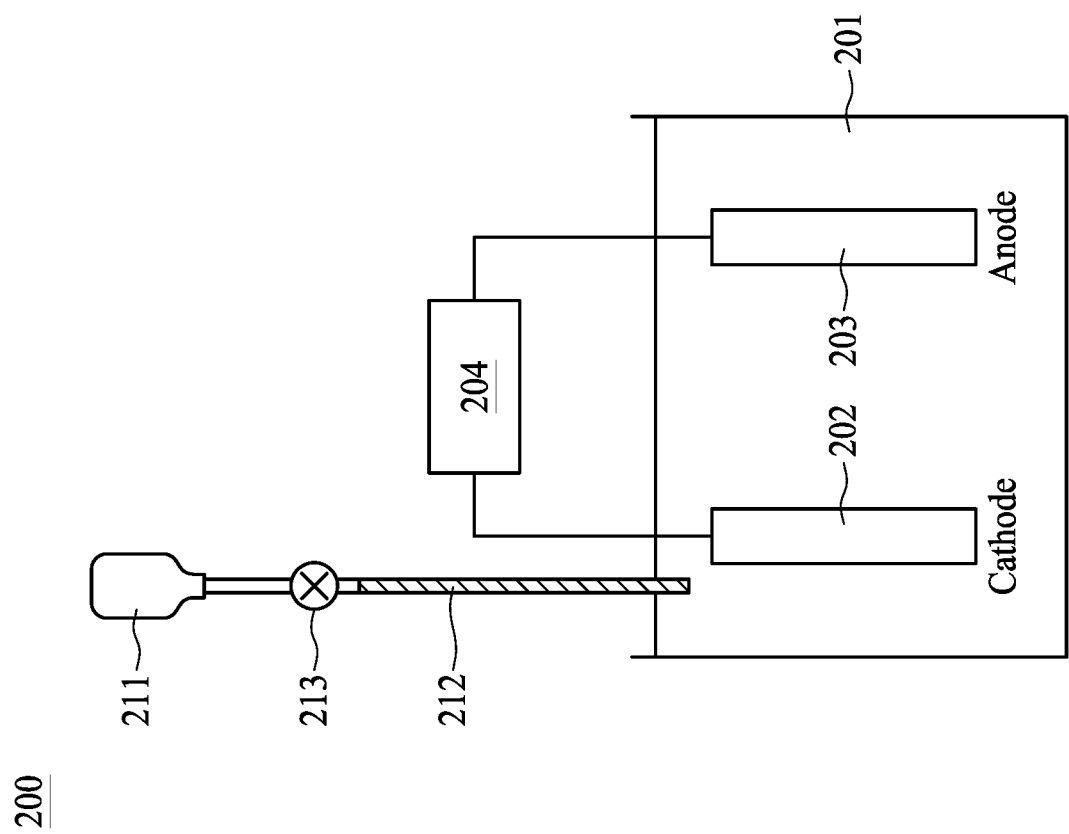
FIG. 2 is a schematic view showing an electroplating system, in accordance with some embodiments of the present disclosure.

Referring to FIG. 2, FIG. 2 is a schematic view showing an electroplating system, in accordance with some embodiments of the present disclosure. The electroplating system 200 includes a plating solution 201, a cathode 202 having at least a portion in the plating solution, an anode 203 having at least a portion in the plating solution and apart from the cathode 202, and a power supply 204 electrically connected to the cathode 202 and the anode 203. In some embodiments, the power supply 204 supplies direct current (D/C constant value or in pulse form). In some embodiments, during an electroplating operation, a workpiece (not shown) can be placed at the cathode 202. In some embodiments, the anode 203 may be a phosphorized copper anode ball (which may include phosphorous with a concentration from about 0.03% to 0.08%).

The plating solution 201 includes soluble salt that provide metallic ions (such as $Cu^{2+}$) for the electroplating operation. In some embodiments, the plating solution 201 further includes complexation reagent, which can bond with the aforesaid metallic ions (such as $Cu^{2+}$) thereby forming a coordination complex. In some embodiments, the plating solution 201 further includes buffering agent, which can be utilized to adjust or stabilize the pH value (i.e. acidity/basicity) of the plating solution 201. In some embodiments, the plating solution 201 further includes active agent such as chloride ion ($Cl^-$), where chloride ion can also be utilized as anode surfactant. In some embodiments, the plating solution 201 further includes other additives, such as brightener that includes chloride ion ($Cl^-$), grain refiner, leveling agent, wetting agent, stress relieving agent, or inhibitor. For example, the polyethylene glycol (PEG) may be attached to the workpiece and react with metallic ions (or phosphorous ion in some cases) and forming a coordination complex, thereby adjusting a reaction rate of the plating (such as decreasing the reaction rate).

In some embodiments, the plating solution 201 includes $CuSO_4 \cdot 5H_2O$ (such as having a concentration about 220 g/L), sulfuric acid (such as having a concentration about 40 g/L), and chloride ion (such as about 40 ppm) for improving shininess. In some other cases, the plating solution 201 may have basic chemical that includes $Cu^{2+}$ and is substantially free of cyanide. In some cases, utilizing basic chemicals during fabrication operations may alleviate the issue of material loss, especially the barrier layers, tantalum nitride layer (TaN), or cobalt layers in a workpiece. For example, tantalum oxide may be formed when tantalum nitride is oxidized, which may further cause reliability issues.

In some embodiments, the plating solution 201 includes phosphorus-based chemical, such as phosphine ($PH_3$) or copper(II) pyrophosphate ($Cu_2P_2O_7$). In the case of phosphine ($PH_3$) utilized as phosphorus-based chemical, phosphine ($PH_3$) in gas form can be supplied by a chemical source 211 via a conduit 212, which may be disposed over an area proximal to the cathode 202 (or over the workpiece), to the plating solution 201. A material of the conduit 212 may be Polytetrafluoroethylene (PTFE), vinyl polymers, polypropylene (PP), polyvinyl chloride (PVC), polyvinylidene difluoride (PVDF), stainless steel, or other suitable materials that can be utilized as pipe. In some embodiments, the electroplating system 200 further includes a mass flow controller 213 attached to the conduit 212 in order to control the supply of the chemical.

In some embodiments, by using a plating solution 201 including $CuSO_4 \cdot 5H_2O$ and $PH_3$ (which may be supplied from the chemical source 211 via the conduit 212), a $Cu_3P$ coating can be formed on a workpiece under certain conditions. In some embodiments, during an electroplating operation, a workpiece (not shown) can be placed at the cathode 202. In some embodiments, the anode 203 may be a phosphorized copper anode ball (which may include phosphorous with a concentration from about 0.03% to 0.08%). The chemical reaction can be summarized as the following:

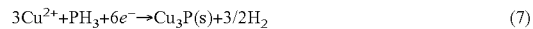

$$3Cu^{2+}+PH_3+6e^- \rightarrow Cu_3P(s)+3/2H_2 \qquad (7)$$

Specifically, when $PH_3$ is supplied into the plating solution 201, phosphorous (such as white phosphorous or red phosphorous) may be formed:

$$PH_3(g) \leftrightarrows P+3H^++3e^- \qquad (8)$$

Herein an activation energy E(V) for the half reaction (8) is about 0.063V to about 0.111V, which has relatively lower threshold, thereby the reaction is relatively easier to be triggered. Furthermore, it should be noted that the requirement of phosphorized copper anode ball regarding the purity of copper can be lowered comparing to conventional plating operations using other types of plating solutions. In some embodiments, the oxide ion in the phosphorized copper anode ball may react with the $H^+$ (which may be from the $PH_3$), thereby forming water, instead of forming oxidized copper residues or copper oxide (which may deteriorate the reliability of plating operation). Such characteristic may help reducing required labor force for plating system maintenance. In alternative embodiments, oxygen may be generated and react with hydrogen as discussed in reaction (7), thereby forming water.

Further, the phosphorous may react with $CuSO_4$, thereby forming $Cu_3P$:

$$11P + 15CuSO_4 + 24H_2O \rightarrow 5Cu_3P + 6H_3PO_4 + 15H_2SO_4 \quad (9)$$

As can be observed in reaction (9) for forming $Cu_3P$, a ratio of phosphorous (P) over $CuSO_4$ in the plating solution is around 0.73 (11:15). It should be noted that herein a temperature of the plating solution 201 may be elevated to a range from about 50° C. to about 60° C. in order to provide energy and trigger the reaction (9) as listed above. Furthermore, a concentration of phosphorous in the plating solution 201 may be relatively greater (as will be discussed below) in order to trigger the reaction (9). In the cases that a concentration of phosphorous in the plating solution 201 is relatively lower and the temperature of the plating solution 201 is relatively lower (e.g. about 20° C. to about 30° C.), copper may be formed instead of $Cu_3P$, as shown in chemical reaction (10):

$$2P + 5CuSO_4 + 8H_2O \rightarrow 5Cu + 2H_3PO_4 + 5H_2SO_4 \quad (10),$$

as can be observed in reaction (10), when forming Cu, a ratio of phosphorous (P) over $CuSO_4$ in the plating solution is around 0.4 (2:5). As previously discussed, the ratio of phosphorous (P) over $CuSO_4$ in the plating solution in reaction (9) is greater than the ratio thereof in reaction (10).

In addition, the $Cu^2$ released from the phosphorized copper anode ball may react with electron, thereby forming $Cu^*$:

$$3Cu^{2+} + 3e^- \rightarrow 3Cu^+ \quad (11)$$

herein an activation energy of reaction (11) may be about 0.159V.

It should be noted that the activation energy of the following reaction (12) may be about 0.520V, which is greater than the activation energy of reaction (13), as will be discussed below. Therefore, it may be less likely to trigger reaction (12) in substantially larger scale under the aforesaid condition:

$$Cu^+ + e^- \leftrightarrows Cu(s) \quad (12)$$

The $Cu^+$ in reaction (11) may further react with electron and phosphorous, thereby forming $Cu_3P$:

$$3Cu^+ + P + 3e^- \rightarrow Cu_3P \quad (13)$$

The phosphorous herein may further catalyze the reaction (13), thereby further increasing the tendency of triggering reaction (13).

Furthermore, in some embodiments, the $Cu_3P$ layer can be utilized as a wetting layer (and deoxidization layer) for forming additional Cu layer. In some embodiments, copper-phosphorous alloy (such as $Cu_3P$) has a dense structure, it can be utilized as diffusion barrier layer for alleviating the diffusion of copper into the underlying structures (such as silicon oxide that can be utilized as insulating layer). Further, phosphorous can be utilized as deoxidizer and wetting agent for copper, thereby alleviating the oxidation of the copper layer due to the exposure to environment may be alleviated. Therefore, an electroplating operation for forming copper layer can be performed on a workpiece that has $Cu_3P$ coating by using the techniques discussed above. For example, copper can be placed at the anode and the workpiece can be placed at the cathode, and $Cu^{2+}$ in the plating solution may become Cu and deposited over the workpiece. In some alternative embodiments, the $Cu_3P$ coating can also be formed at cathode side. It should be noted that other suitable electroplating techniques can also be utilized.

In some embodiments, the techniques discussed in the electroless plating operation (FIG. 1) and the electroplating operation (FIG. 2) can be applied to the fabrication of the fabrication of the following embodiments.

Figure 3A:
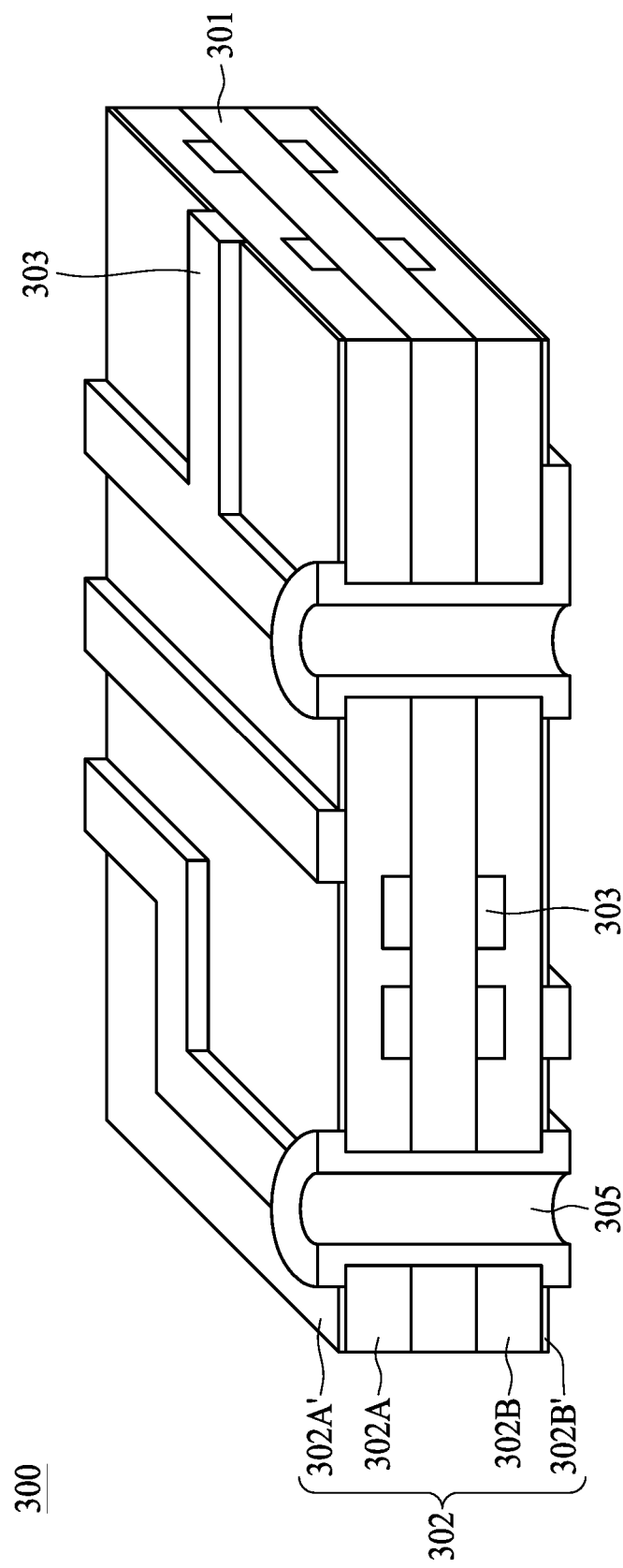
FIG. 3A is a perspective view of a wiring substrate, in accordance with some embodiments of the present disclosure.

Referring to FIG. 3A, FIG. 3A is a perspective view of a wiring substrate, in accordance with some embodiments of the present disclosure. A first embodiment of a wiring substrate 300 is discussed in FIG. 3A. The wiring substrate 300 includes a core substrate 301 and laminating layers 302 over both sides of the core substrate 301. In some embodiments, the core substrate 301 may be made by impregnating reinforcing material with resin, wherein glass cloth, aramid fabric, glass fabric, fiberglass resin (such as FR4), or the like, may be utilized as reinforcing material, and the resin may be epoxy resin, BT (bismaleimide triazine) resin, or the like. The laminating layers 302 may be in a configuration of buildup multilayer(s), such as including inner layers 302A and 302B respectively attached to a front surface and a back surface of the core substrate 301, and outer layers 302A' and 302B' respectively laminated over the inner layers 302A and 302B. The laminating layers 302 may include Ajinomoto build-up film (ABF), which includes epoxy resin, additive, stabilizer, flame retardant, and Polyethylene terephthalate (PET) film. Alternatively, the laminating layers 302 may include other suitable laminating material, such as epoxy-based materials, resin-based materials, polymer-based materials, ceramic, or silicon. In some cases, ABF may be formed without using thermal compression operation or laser ablation (which may roughen the edges of the core substrate 301 and generate residues), thereby providing improved reliability. ABF may be suitable to be implemented in advanced technology, such as power semiconductor device, high frequency device, advanced wiring board, printed circuit board, integrated circuit board, or the like. In some embodiments, some blind conductive via or buried conductive via (not shown) can be formed in the laminating layers 302 to connect between the wirings 303 at different levels.

The wiring 303 can be formed by patterning techniques. In some embodiments, wiring 303 can be formed over the core substrate 301 and at the levels of where the laminating layers 302 would be formed and followed by patterning (subtractive process). In some alternative embodiments, sacrificial layers are patterned over the core substrate 301, followed by forming conductive layer over the sacrificial layer, and selective removal operation (additive process). In some embodiments, the wiring 303 may include copper-phosphorous alloy, such as $Cu_3P$, and can be formed by electroless plating operation (as discussed in FIG. 1) and/or electroplating operation (as discussed in FIG. 2). The copper-phosphorous alloy (especially $Cu_3P$) may provide improved device performance and high compatibility in complexed wiring configuration, which may also have smaller wiring dimension.

In some alternative embodiments, the wiring 303 may include copper and can be formed with multi-step operation. For example, the wiring 303 can be formed by depositing a thin copper film using an electroless plating operation (as discussed in FIG. 1), followed by depositing a thicker copper film using an electroplating operation (as discussed in FIG. 2). Copper wiring formed by the electroless plating operation may have greater reliability, while forming copper wiring by electroplating operation may have higher efficiency.

In some alternative embodiments, the wiring 303 may include copper and copper-phosphorous alloy (such as $Cu_3P$). For example, the wiring 303 can be formed by depositing a thin $Cu_3P$ film using an electroless plating operation (as discussed in FIG. 1), followed by depositing a thicker copper film directly over the thin $Cu_3P$ film using an electroplating operation (as discussed in FIG. 2). Herein the thin $Cu_3P$ film can be utilized as a wetting layer (and deoxidization layer) for copper film.

In some embodiments, the wiring substrate 300 further includes a plated through hole (PTH) 305, which may be further electrically connected to solder, wiring structure or a terminal of device. In some embodiments, the wiring substrate 300 further includes non-plated through hole (not shown), which can be engaged with fastening members.

Figure 3B:
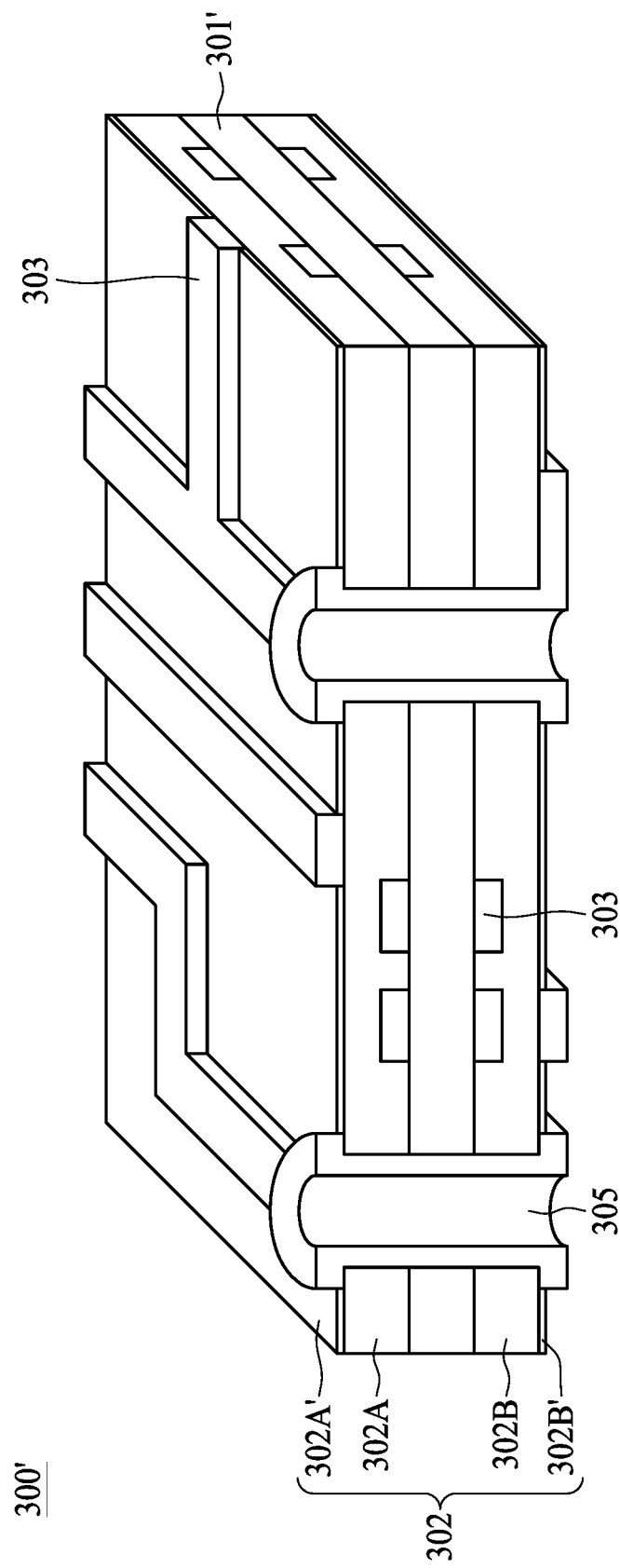
FIG. 3B is a perspective view of a wiring substrate, in accordance with some embodiments of the present disclosure.

Referring to FIG. 3B, FIG. 3B is a perspective view of a wiring substrate, in accordance with some embodiments of the present disclosure. A second embodiment of a wiring substrate 300' is discussed in FIG. 3B. The wiring substrate 300' is similar to the wiring substrate 300 discussed in FIG. 3A, but the difference resides in that the wiring substrate 300' utilizes coreless substrate configuration. Alternatively stated, the core substrate 301 in the wiring substrate 300 of FIG. 3A is substituted with a coreless substrate 301', as shown in FIG. 3B. Although the outlook of the wiring substrate 300 discussed in FIG. 3A may be similar to the outlook of the wiring substrate 300' discussed in FIG. 3B, the mechanical properties of two wiring substrates may be different.

Specifically, the coreless substrate 301' may be made of build-up resin, for example, ABF substrate. Furthermore, the laminating layers 302 formed over both sides of the coreless substrate 301' is made of pre-preg material, which may help facilitating the structural strength of the wiring substrate 300'.

In some embodiments, wiring 303 can be formed over the core substrate 301 and in the laminating layers 302 and followed by patterning. In some embodiments, the wiring 303 includes copper-phosphorous alloy (such as $Cu_3P$) and copper. Specifically, a layer of wiring 303 can be formed by depositing a thin $Cu_3P$ film by using electroless plating operation (as discussed in FIG. 1), followed by an electroplating operation (as discussed in FIG. 2) for forming a copper film over the thin $Cu_3P$ film. As previously discussed, copper-phosphorous alloy may possess improved wettability and a more condensed structure, thus can be utilized as a wetting layer (and deoxidization layer) for copper layer. In some embodiments, a thickness of the thin $Cu_3P$ film may be down to 1 µm, or from 1 µm to about 3 µm. Furthermore, when forming a plated through hole (PTH) 305 or a blind conductive via, the conformability of plated copper can be improved, thereby the aforesaid techniques can be utilized in high aspect ratio via formation or wiring with smaller dimension. In some alternative embodiments, the wiring 303 includes a first $Cu_3P$ layer as a wetting layer and a second $Cu_3P$ layer over the wetting layer. For example, each $Cu_3P$ layers may have different composition, so that each $Cu_3P$ layers exhibit different properties. For example, the first $Cu_3P$ layer and the second $Cu_3P$ layer can be collectively utilized as wetting layer. For another example, one of the first $Cu_3P$ layer and the second $Cu_3P$ layer is utilized as a wetting layer and another one is utilized as barrier layer. For another example, the first $Cu_3P$ layer is utilized as a wetting layer and the second $Cu_3P$ layer is utilized as a conductive wiring. In some alternative embodiments, instead of copper layer, an additional conductive layer is formed over the $Cu_3P$ layer. In some alternative embodiments, the wiring 303 includes a copper layer as a wetting layer and a $Cu_3P$ layer over the wetting layer. The aforesaid alternative embodiments may be applied to specific products that have specific requirement.

A third embodiment of a wiring substrate 400 is discussed in FIG. 4A to FIG. 4E.

Figure 4A:
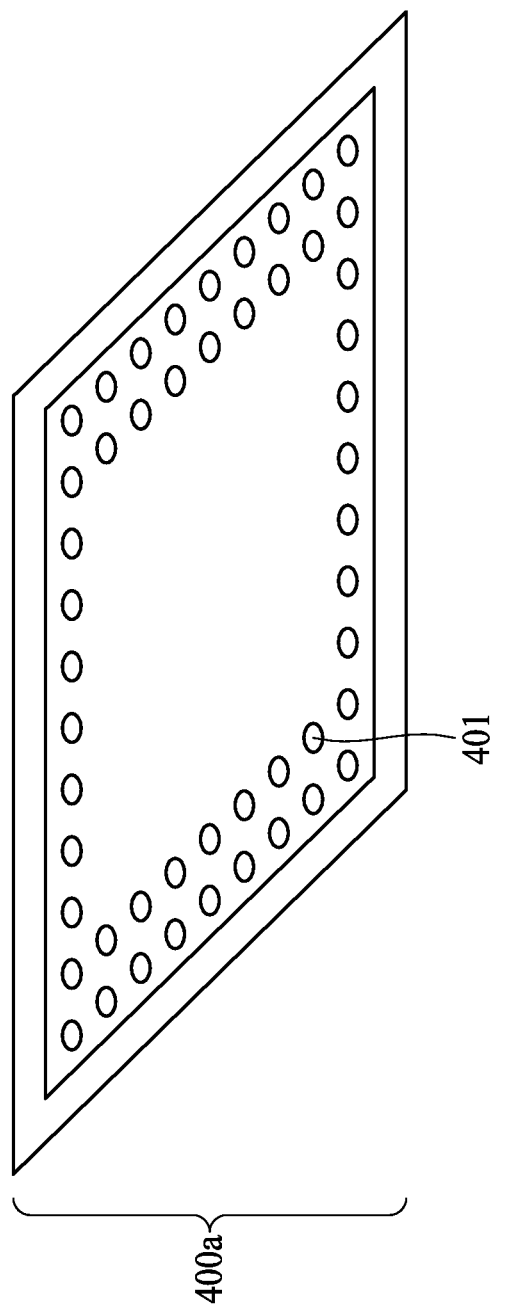
FIG. 4A to FIG. 4E are cross sections of a wiring substrate during intermediate stages of manufacturing operations, in accordance with some embodiments of the present disclosure.

Referring to FIG. 4A, FIG. 4A is a cross section of a wiring substrate during intermediate stages of manufacturing operations, in accordance with some embodiments of the present disclosure. A ceramic layer 400a is provided. In some embodiments, the ceramic layer 400a can be made by mixing ceramic powder with glass material (around 30% to 50%) and adhesive material, thereby forming a slurry. Herein the ceramic powder may be $Al_2O_3$, AlN, BeO, or other suitable materials. The slurry is subsequently dried and thereby formed to have a shape of thin layer. Furthermore, a plurality of vias 401 are formed by punching operation.

Figure 4B:
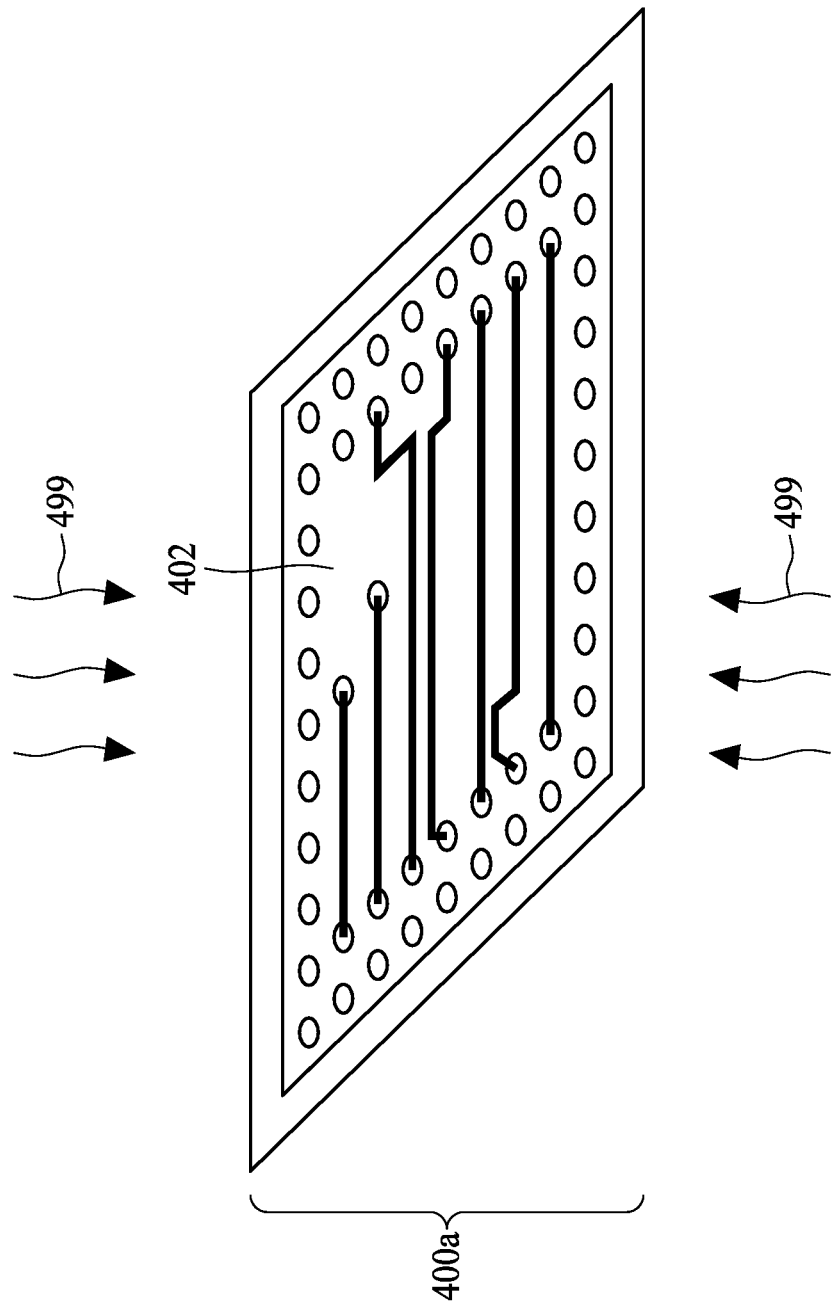

Referring to FIG. 4B, FIG. 4B is a cross section of a wiring substrate during intermediate stages of manufacturing operations, in accordance with some embodiments of the present disclosure. Subsequently circuit and pads can be formed. In some embodiments, an electroless plating 499 (as discussed in FIG. 1) can be performed to form a copper-phosphorous alloy (such as $Cu_3P$) layer 402 over a front surface and/or a back surface of the ceramic layer 400a. Herein the copper-phosphorous alloy may possess improved wettability and a more condensed structure, thus can be utilized as a wetting layer (and deoxidization layer) for copper layer, which will be discussed in FIG. 4C. In some embodiments, a thickness of the copper-phosphorous alloy layer 402 may be down to 1 µm or from 1 µm to about 3 µm. In some embodiments, the copper-phosphorous alloy layer 402 may also be formed in the plurality of vias 401.

Figure 4C:
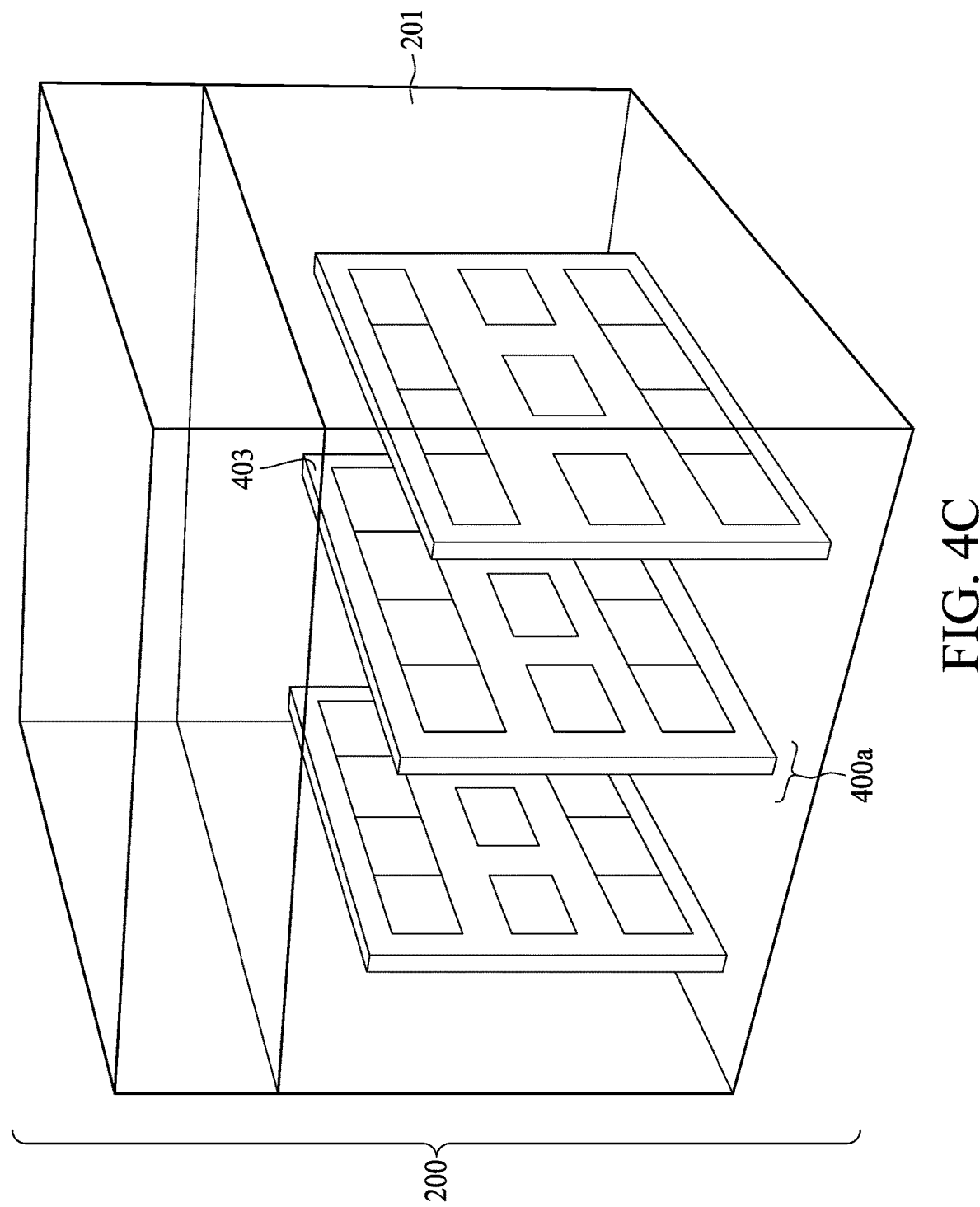

Referring to FIG. 4C, FIG. 4C is a cross section of a wiring substrate during intermediate stages of manufacturing operations, in accordance with some embodiments of the present disclosure. A copper layer 403 is formed over the copper-phosphorous alloy layer 402 (shown in FIG. 4B) by an electroplating operation. In some embodiments, a thickness of the copper layer 403 may be in a range from about 20 µm to about 100 µm. In some embodiments, the electroplating operation can be performed by the electroplating system 200 as discussed in FIG. 2, wherein the ceramic layer 400a is immersed in the plating solution 201 in order to perform electroplating operation. In addition, a lithography operation can be performed to define a position of electrical wiring path as well as a position of conductive pad. In some alternative embodiments, instead of copper layer, an additional copper-phosphorous alloy layer is formed over the copper-phosphorous alloy layer 402 (shown in FIG. 4B). For example, each copper-phosphorous alloy layers may have different composition, so that each copper-phosphorous alloy layers exhibit different properties and functionalities. In some embodiments, the additional copper-phosphorous alloy layer can be formed by electroless plating operation or electroplating operation. In some alternative embodiments, instead of copper layer, an additional conductive layer is formed over the copper-phosphorous alloy layer 402 (shown in FIG. 4B). In some alternative embodiments, a copper layer is formed as wetting layer and a copper-phosphorous alloy layer is formed over the copper layer. The aforesaid alternative embodiments may be applied to specific products that have specific requirement.

Figure 4D:
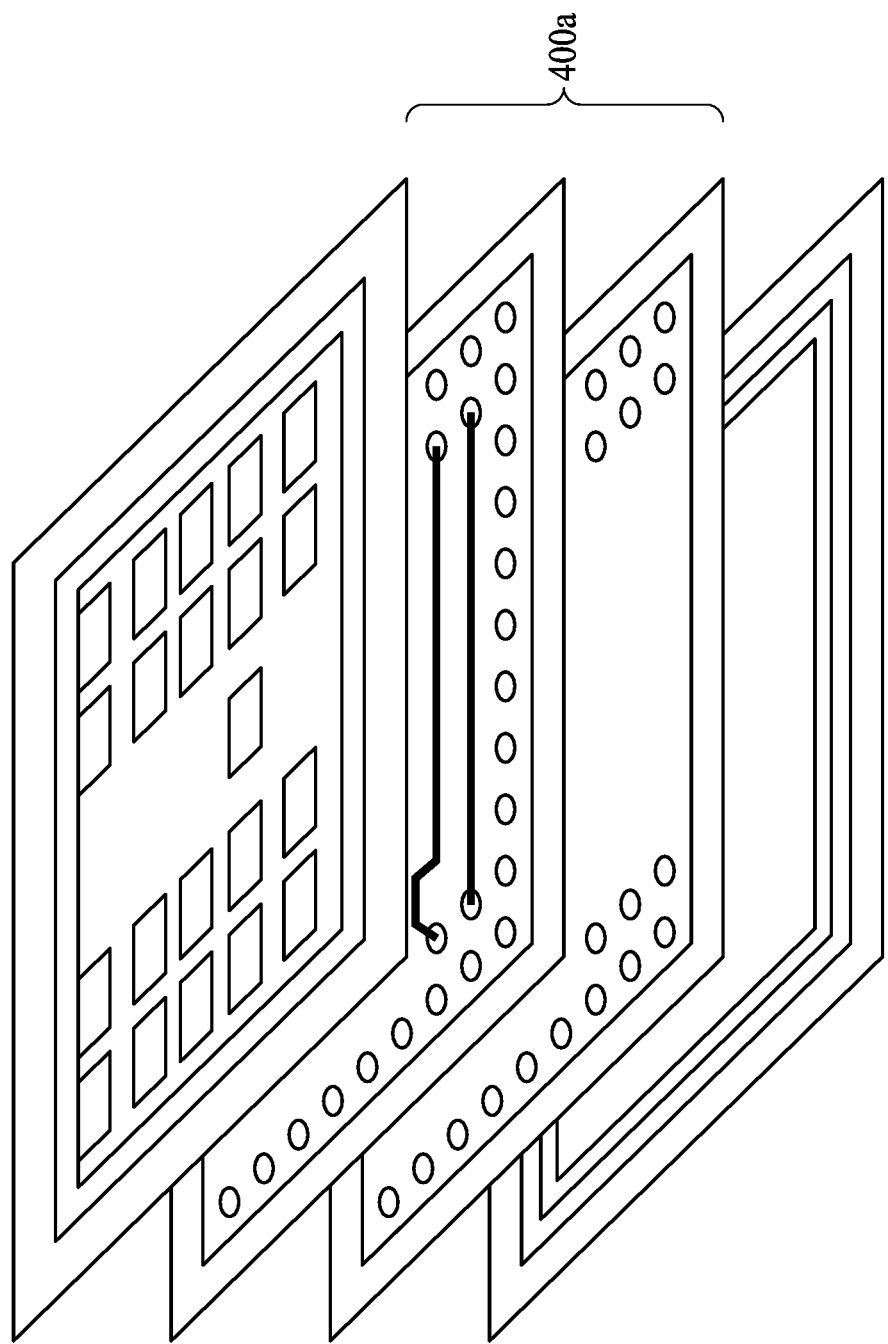

Referring to FIG. 4D, FIG. 4D is a cross section of a wiring substrate during intermediate stages of manufacturing operations, in accordance with some embodiments of the present disclosure. A plurality of ceramic layers 400a can be stacked and laminated.

Figure 4E:
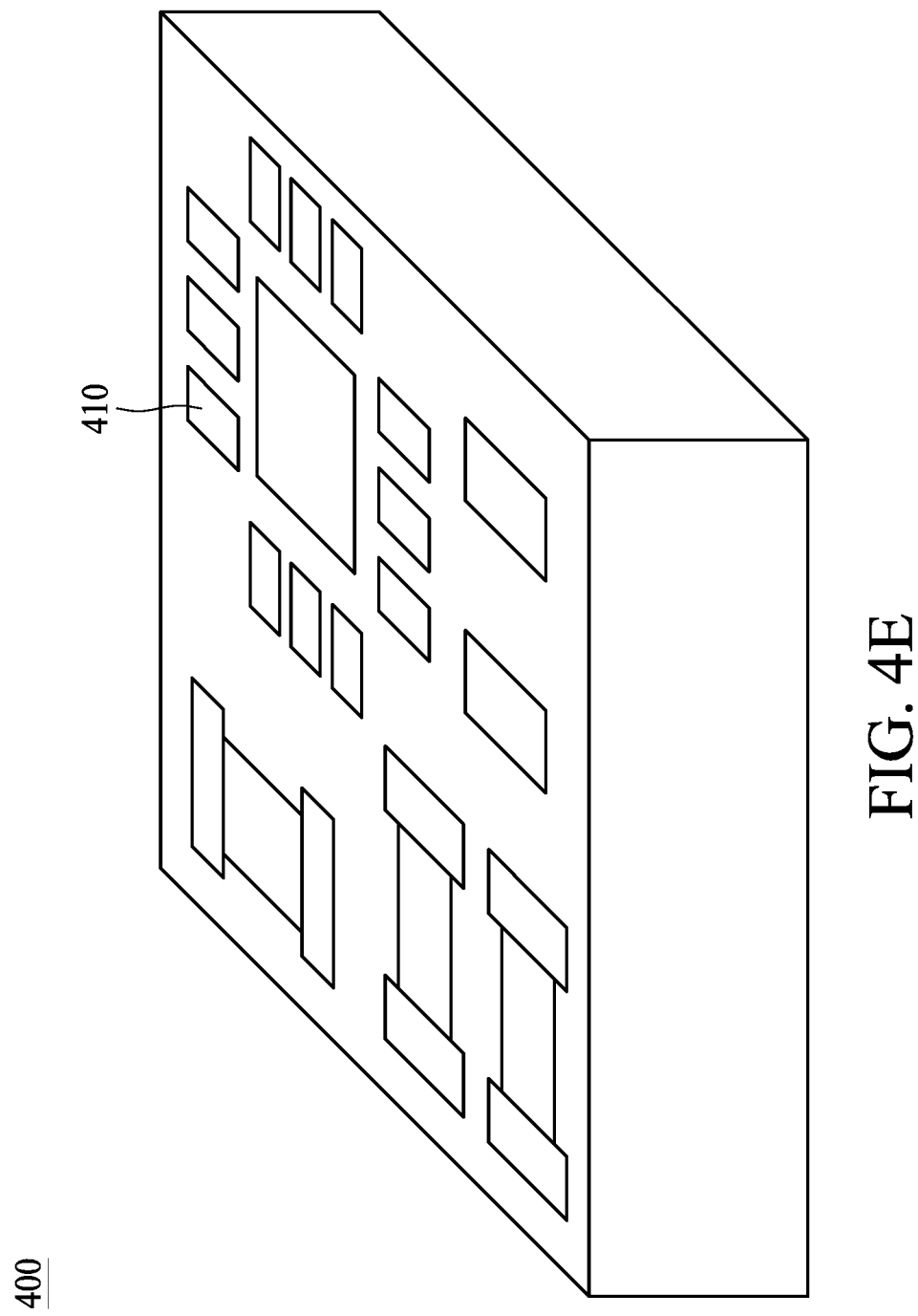

Referring to FIG. 4E, FIG. 4E is a cross section of a wiring substrate during intermediate stages of manufacturing operations, in accordance with some embodiments of the present disclosure. A sintering operation can be performed to obtain a wiring substrate 400. A temperature of the sintering operation may be in a range from about 850° C. to about 900° C. Furthermore, a post processing (such as forming an additional wiring 410 at an outer surface of the wiring substrate 400, isolation, additional heating, singulation, testing) can be performed. As previously discussed, a combination of copper-phosphorous alloy layer and a copper layer can help forming a high-aspect ratio via with improved reliability and narrower wiring. Furthermore, the copper-phosphorous alloy layer can be a wetting layer for the copper layer, thereby improving conformability and reliability of copper layer.

The techniques of electroless plating and electroplating as discussed in FIG. 1 to FIG. 2 can further be applied to an interconnect package structure, as will be discussed in FIG. 5A to FIG. 5H.

Figure 5A:
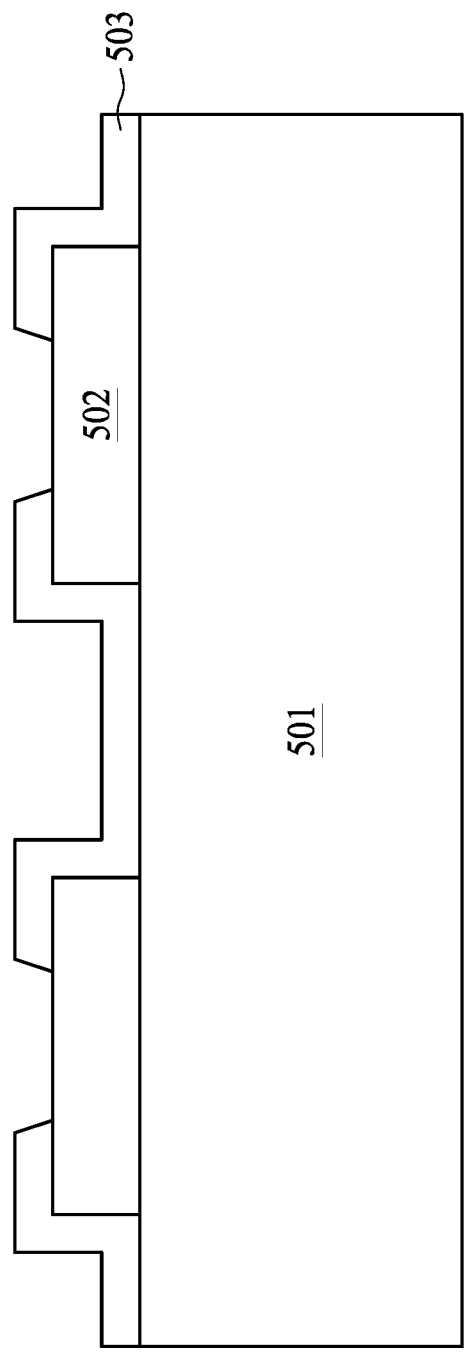
FIG. 5A to FIG. 5H are cross sections of an interconnect package structure during intermediate stages of manufacturing operations, in accordance with some embodiments of the present disclosure.

Referring to FIG. 5A, FIG. 5A is a cross section of an interconnect package structure during intermediate stages of manufacturing operations, in accordance with some embodiments of the present disclosure. The techniques of electroless plating and electroplating as respectively discussed in FIG. 1 to FIG. 2 can be utilized in the interconnect package structure, such as a package structure. In FIG. 5A, a semiconductor substrate 501 (or in some embodiments, can be a silicon interposer) is provided, and one or more conductive layers 502 can be formed over the semiconductor substrate 501. In some of the embodiments, the semiconductor substrate 501 may be a silicon substrate. An insulation layer 503 is formed over the semiconductor substrate 501 and selectively removed to expose at least a portion of the conductive layer 502. In some embodiments, the insulation layer 503 includes $SiO_2$. In the embodiments that the semiconductor substrate 501 is a silicon interposer, the thickness thereof may be in a range from about 20 µm to about 50 µm.

Figure 5B:
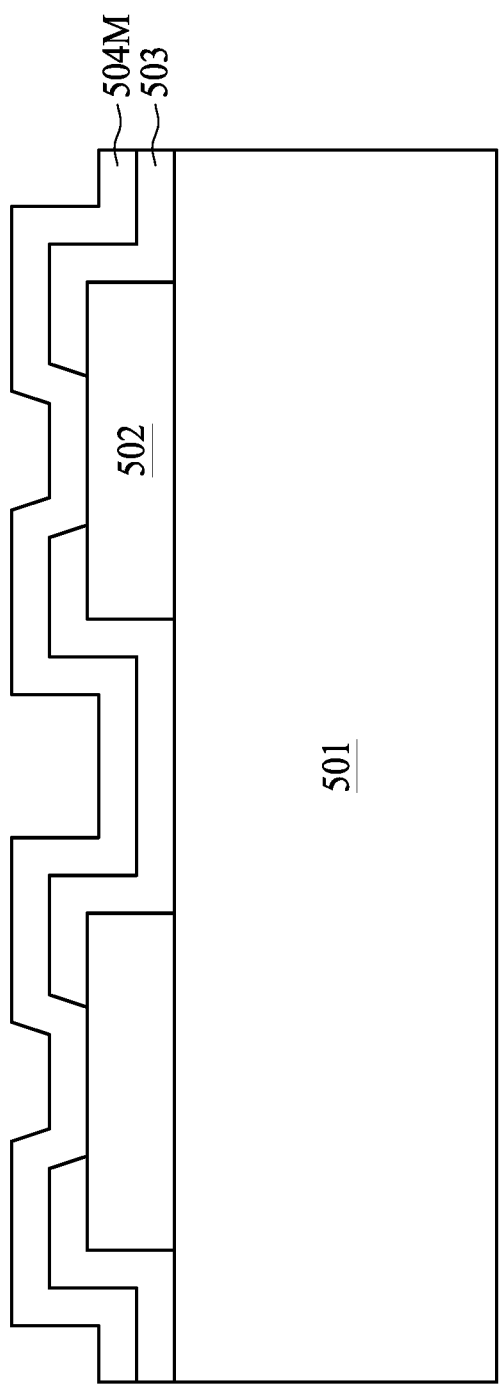

Referring to FIG. 5B, FIG. 5B is a cross section of an interconnect package structure during intermediate stages of manufacturing operations, in accordance with some embodiments of the present disclosure. An under bump metallization (UBM) material layer 504M is formed over the insulation layer 503. The UBM material layer 504M may have multi-layer structure, for example, including an adhesion layer, a diffusion barrier layer over the adhesion layer, and a copper-phosphorous alloy layer (such as $Cu_3P$) over the diffusion barrier layer, which may be formed by techniques of electroless plating similar to the discussion in FIG. 1. A thickness of the copper-phosphorous alloy layer may be in a range from about 1 µm to about 3 µm.

In some embodiments, the adhesion layer is configured to alleviate lattice mismatch issue caused by underlying silicon surface (such as by eutectic bonding). The adhesion layer may include at least one of (a) metal layer (such as Ag, Al, Au, et cetera) that has lattice constant relatively closer to silicon, (b) metal silicide layer (such as nickel silicide, cobalt silicide, palladium silicide, et cetera), or (c) wetting layer (such as nickel layer, or the like), wherein lattice mismatch between nickel and silicon can be down to around 0.4%, and an adhesion between nickel and silicon may be adequate. In some embodiments, a thickness of the adhesion layer may be in a range from about 0.5 µm to about 2 µm.

In some embodiments, the diffusion barrier layer may include at least one of (a) a cobalt phosphorus (CoP) layer, which may be formed by techniques of electroless plating similar to the discussion in FIG. 1, (b) a nickel layer, which can be formed by electroless plating operation, or (c) a refractory metal layer, metal derivatives or metal alloy (such as Ti, W, Mo, Ta, V, titanium tungsten, TiW nitride, $W_2N$, TiN, TaN, et cetera, which can be formed by physical vapor deposition). In some embodiments, a thickness of the diffusion barrier layer may be in a range from about 0.1 µm to about 0.5 µm. The diffusion barrier layer can be utilized to alleviate diffusion, and may be able to decrease internal stress.

Figure 5C:
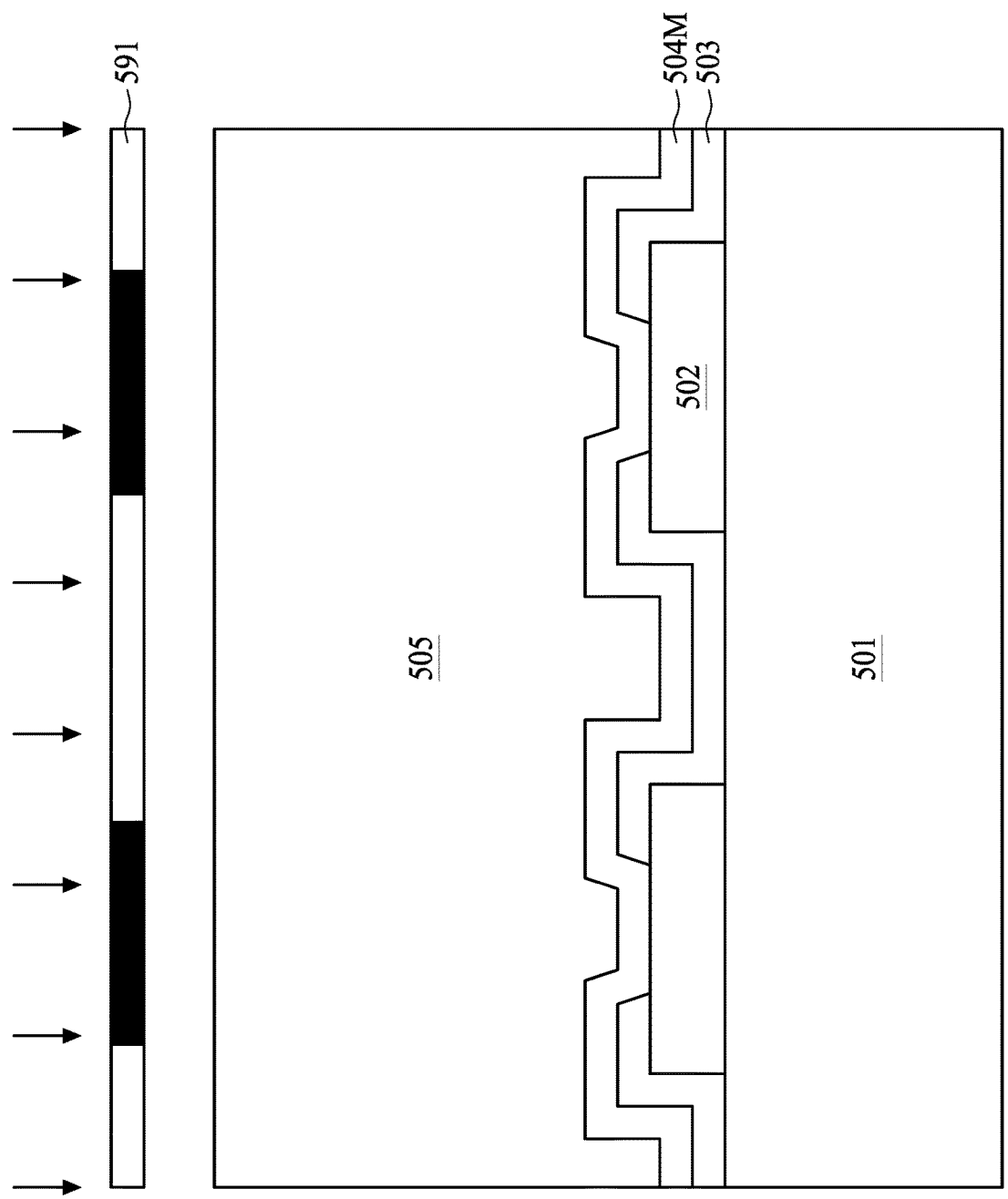

Referring to FIG. 5C, FIG. 5C is a cross section of an interconnect package structure during intermediate stages of manufacturing operations, in accordance with some embodiments of the present disclosure. A photoresist layer 505 is formed over the UBM material layer 504M, and a photolithography operation utilizing a mask 591 can be performed.

Figure 5D:
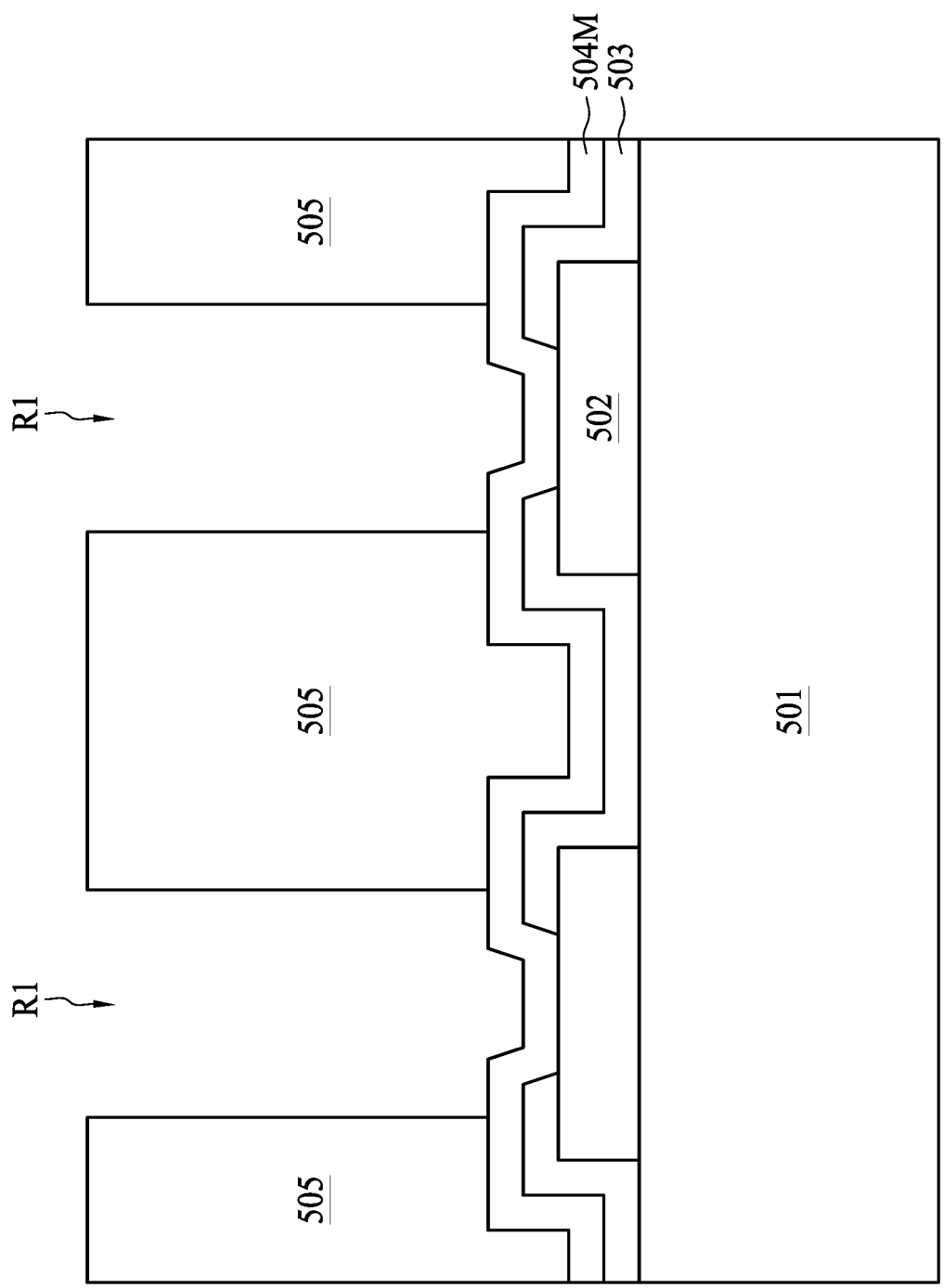

Referring to FIG. 5D, FIG. 5D is a cross section of an interconnect package structure during intermediate stages of manufacturing operations, in accordance with some embodiments of the present disclosure. a plurality of recesses R1 corresponding to the conductive layers 502 is defined in photoresist layer 505, and at least a portion of the UBM material layer 504M is thereby exposed from the photoresist layer 505.

Figure 5E:
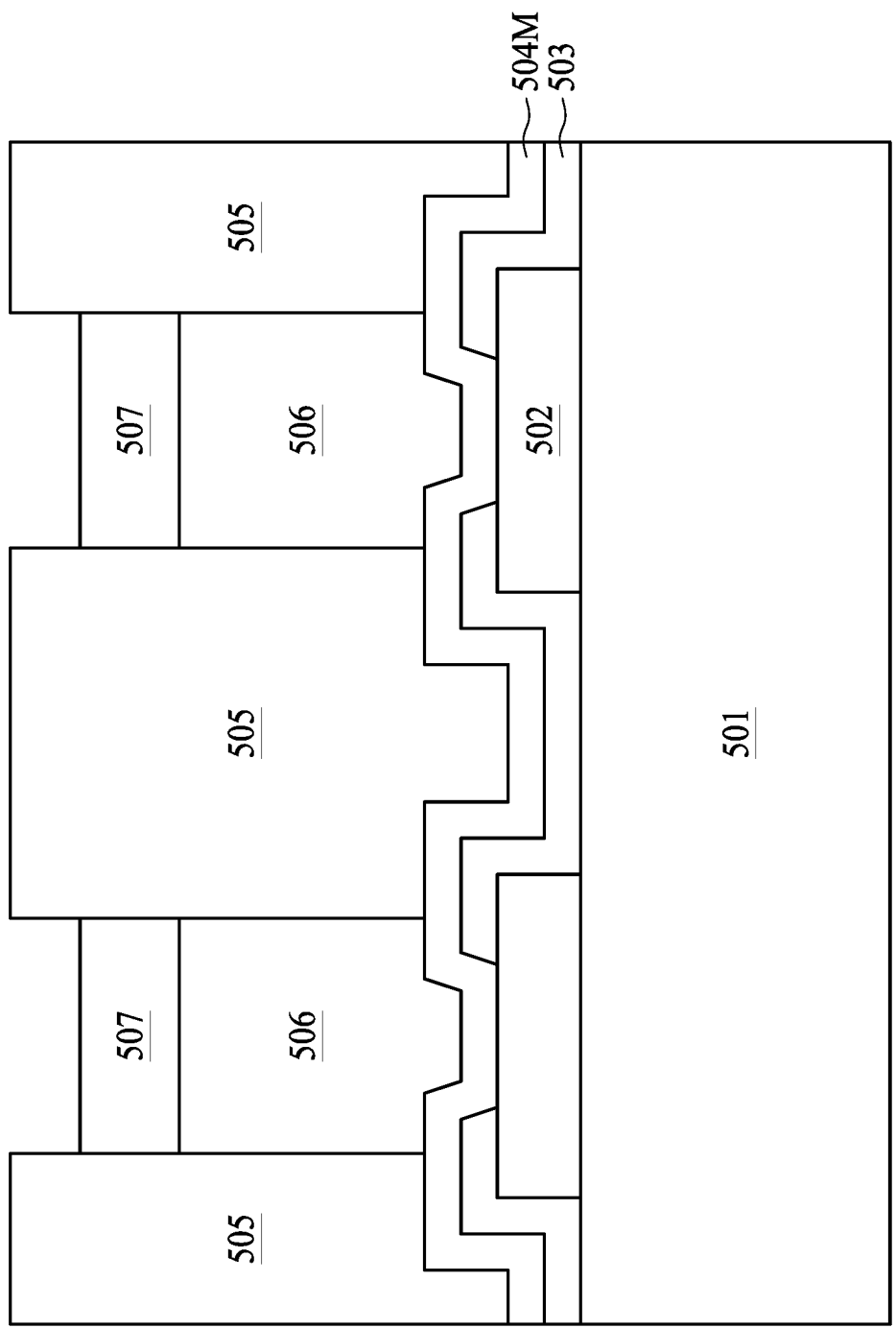

Referring to FIG. 5E, FIG. 5E is a cross section of an interconnect package structure during intermediate stages of manufacturing operations, in accordance with some embodiments of the present disclosure. Copper layer 506 may be formed in the recesses R1, wherein the copper layer 506 may be in direct contact with the UBM material layer 504M, for example, the copper-phosphorous alloy layer of the UBM material layer 504M. In some embodiments, the copper layer 506 can be formed by electroplating operation, which may have improved efficiency as previously discussed. In some embodiments, a thickness of the copper layer 506 may be in a range from about 8 µm to about 10 µm. An alloy layer 507 is subsequently formed over the copper layer 506 and in the recesses R1. In some embodiments, a thickness of the copper layer 506 may be in a range from about 8 µm to about 10 µm. In some embodiments, the alloy layer 507 may include Sn—Ag alloy such as Sn, Ag, Cu, and Sb (such as 96.3% Sn, 3% Ag, 0.5% Cu, 0.2% Sb). In some alternative embodiments, the alloy layer 507 may include Sn, Ag, Bi, and Cu (such as 93.3% Sn, 3.1% Ag, 3.1% Bi, 0.5% Cu). In some embodiments, a thickness of the alloy layer 507 may be in a range from about 10 µm to about 15 µm. In some embodiments, the alloy layer 507 can be utilized as a conductive bump for subsequent bonding operation.

Figure 5F:
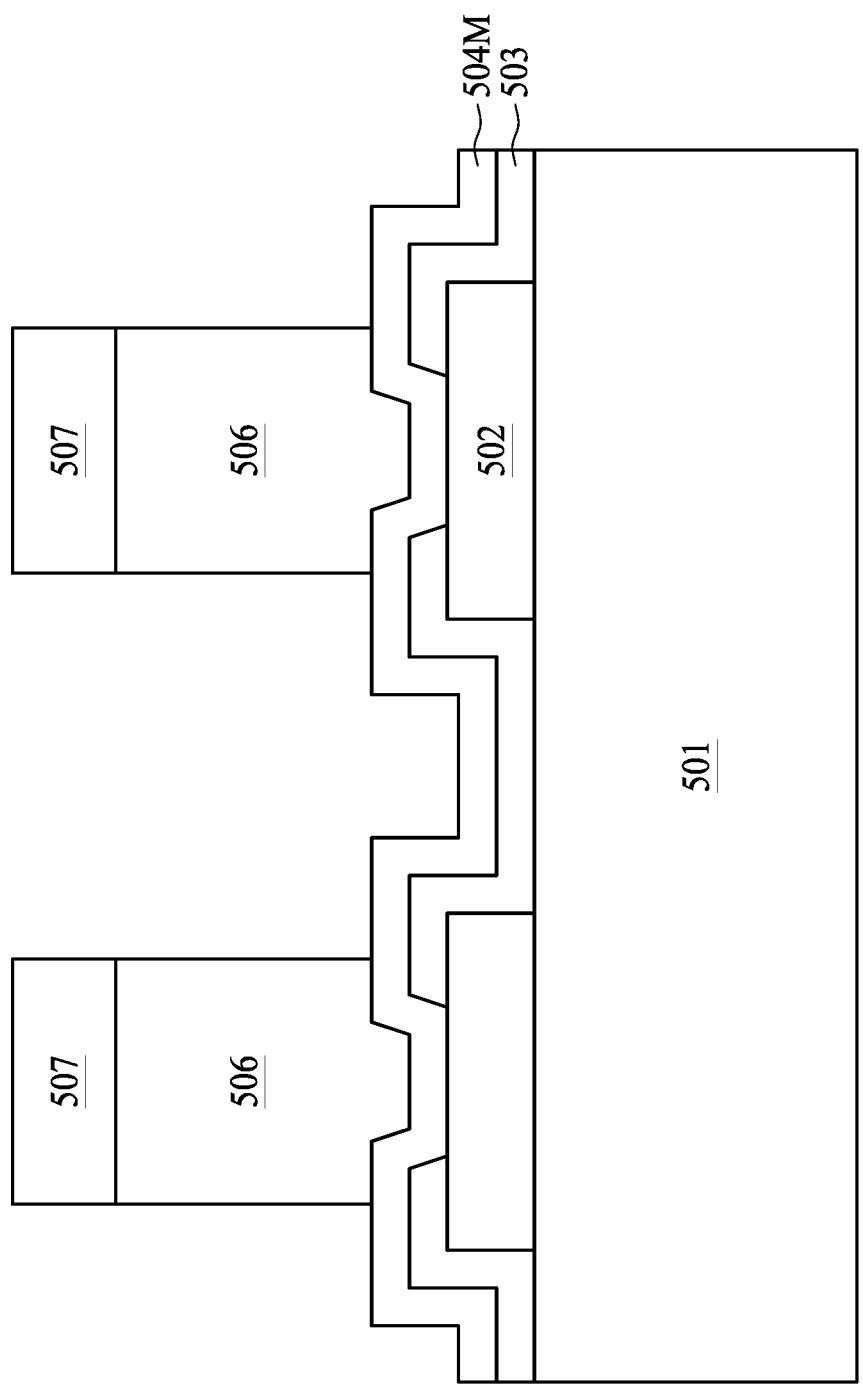

Referring to FIG. 5F, FIG. 5F is a cross section of an interconnect package structure during intermediate stages of manufacturing operations, in accordance with some embodiments of the present disclosure. The photoresist layer 505 is removed and a sidewall of the copper layer 506 as well as a sidewall of the alloy layer 507 may be exposed. In some embodiments, the photoresist layer 505 is removed by performing a lift-off operation.

Figure 5G:
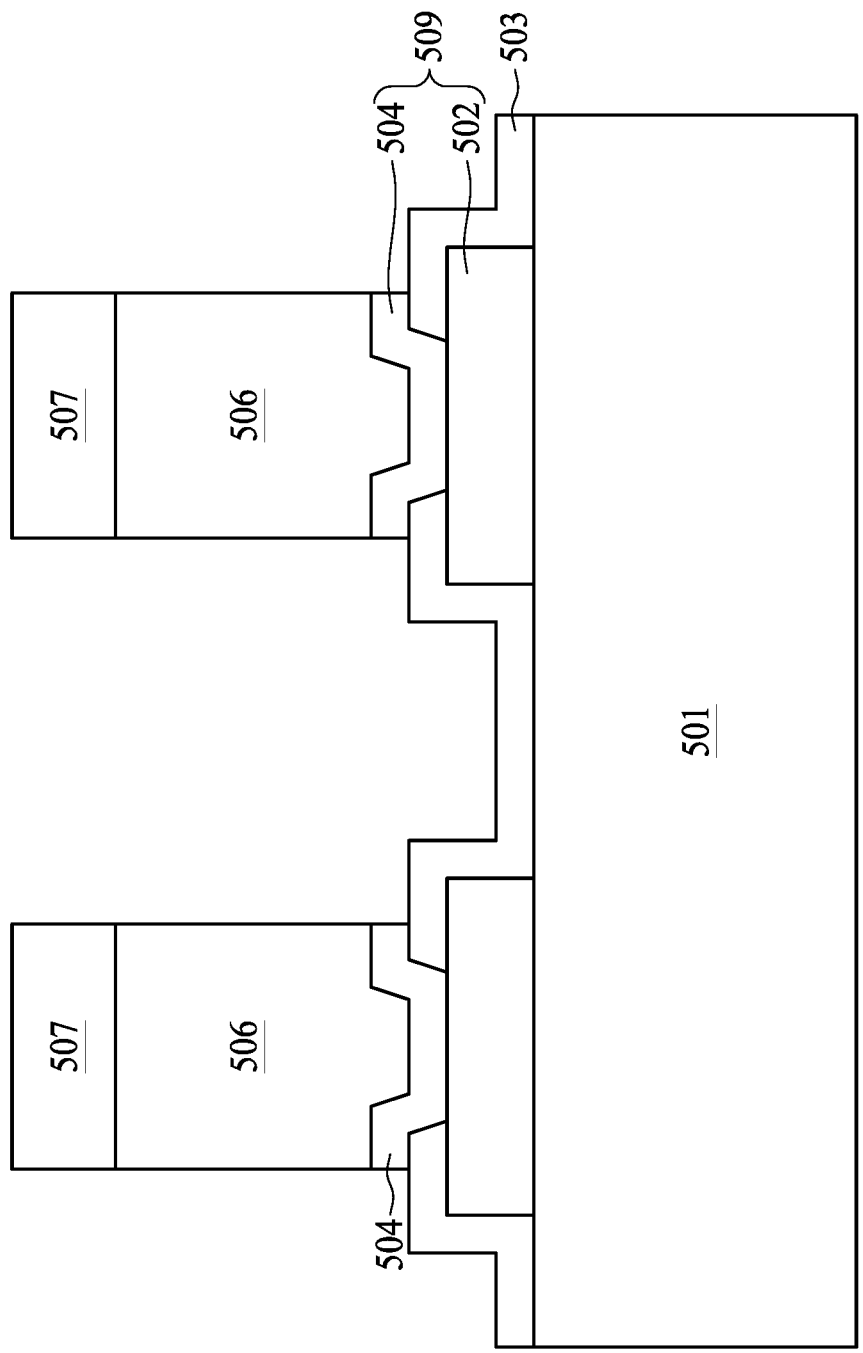

Referring to FIG. 5G, FIG. 5G is a cross section of an interconnect package structure during intermediate stages of manufacturing operations, in accordance with some embodiments of the present disclosure. In some embodiments, a portion of UBM material layer 504M that is not under a coverage of the copper layer 506 is removed and thereby exposing an underlying portion of the insulation layer 503 and forming a UBM layer 504 (which is patterned version of the UBM material layer 504M). In some embodiments, the removal operation may include photolithography operation, etching operation, or other suitable removal operation. Thereby, the remaining UBM layer 504 and the conductive layer 502 can be collectively referred as a conductive pad 509. Alternatively stated, the conductive pad 509 includes copper-phosphorous alloy (such as $Cu_3P$).

Figure 5H:
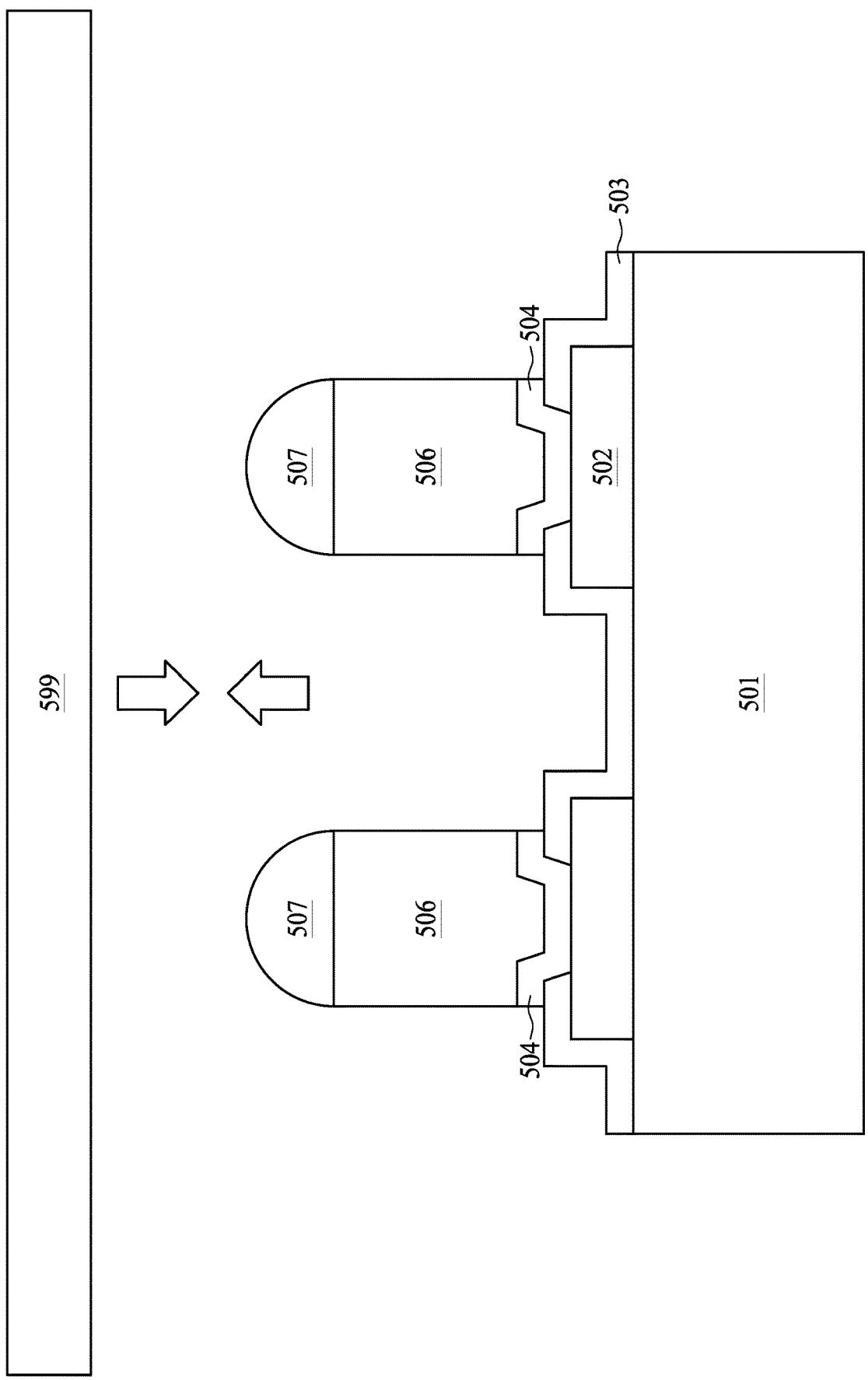

Referring to FIG. 5H, FIG. 5H is a cross section of an interconnect package structure during intermediate stages of manufacturing operations, in accordance with some embodiments of the present disclosure. A reflow operation can be performed and forming a pillar that includes copper-based alloy and Sn—Ag alloy. The semiconductor substrate 501 can be bonded to a carrier 599 (such as an IC board or a substrate), thereby forming an interconnect package. In some embodiments, the conductive pad 509 including copper-phosphorous alloy as discussed in the present disclosure can be applied to other multilayer wiring structures, such as wafer substrate, PCB, interposer, redistribution layer, core substrate, coreless substrate, ceramic substrate, or the like. Such configuration may improve the reliability of electrical connection and the properties thereof.

The techniques of electroless plating and electroplating as discussed in FIG. 1 to FIG. 2 can further be applied to a wiring substrate, as will be discussed in FIG. 6A to FIG. 6C. Specifically, in the applications related to printed circuit board (PCB) and integrated circuit (IC) carrier, it is important to alleviate the issue of resistance caused by narrower dimension of conductive paths. Especially when transmitting a high-frequency signal (such as clock signal), skin depth effect may occur. That is, electrons may accumulate at the surface of conductive wirings, thereby increasing resistance and deteriorate device performance. Comparative approaches, such as merely increasing a dimension of the conductive wirings along one direction, may not effectively address the aforesaid issues. In order to address the aforesaid issues, the plating techniques discussed in FIG. 1 and FIG. 2 can be applied in order to further improve the design of configuration of conductive paths in the printed circuit board (PCB) and integrated circuit (IC) carrier. For example, an effective surface area of the conductive wirings for transmitting high-frequency signal can be substantially increased to effectively address the issues of skin depth effect.

Figure 6A:
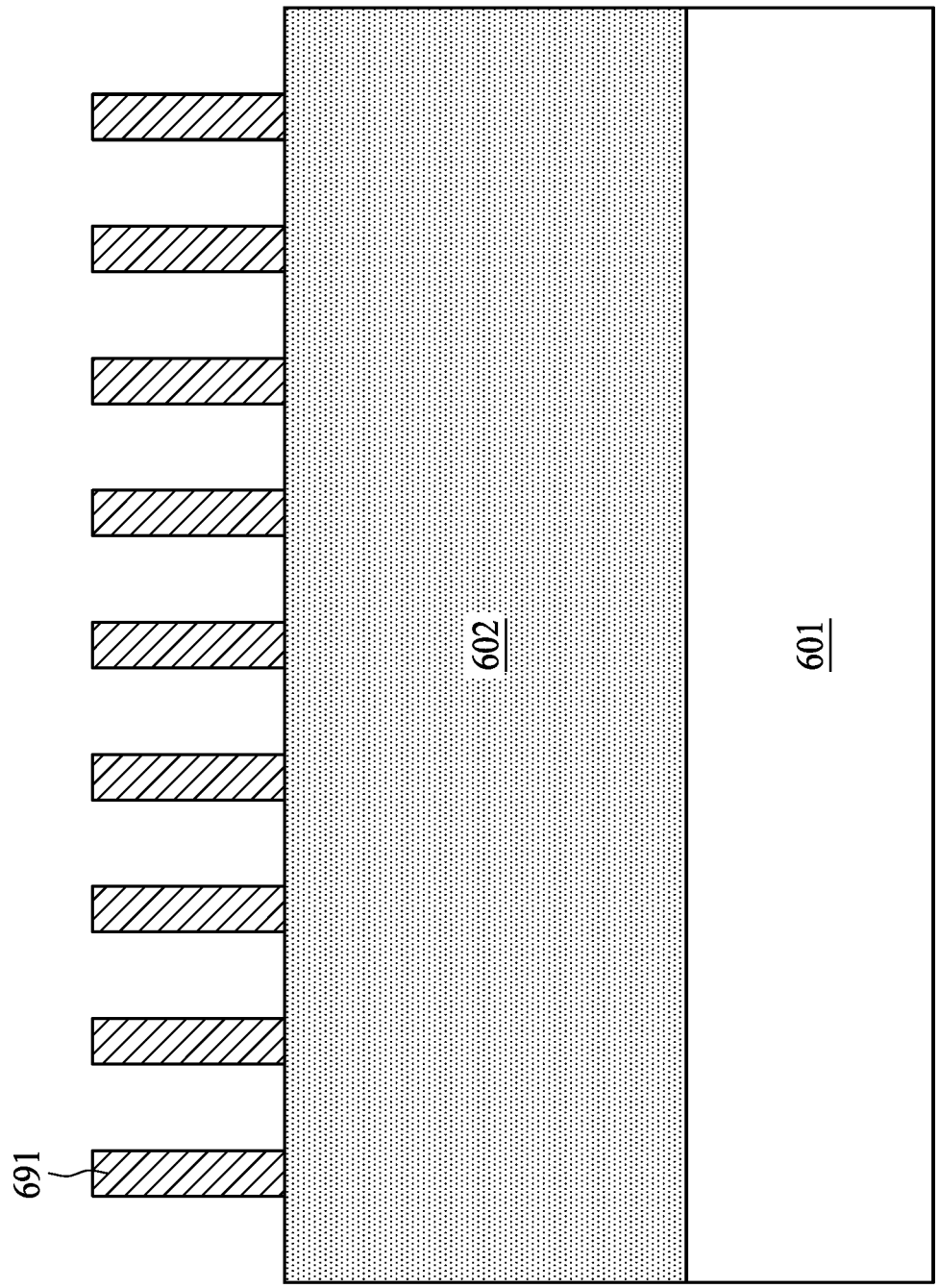
FIG. 6A to FIG. 6C are cross sections of a multilayer wiring structure during intermediate stages of manufacturing operations, in accordance with some embodiments of the present disclosure.

Referring to FIG. 6A, FIG. 6A is a cross section of a multilayer wiring structure during intermediate stages of manufacturing operations, in accordance with some embodiments of the present disclosure. A copper-phosphorous alloy layer 602 (such as $Cu_3P$) is formed over a portion of a substrate 601, which can be a material of a portion of integrated circuit board or printed circuit board. In some embodiments, the substrate 601 can also be referred to an integrated circuit board or printed circuit board during an intermediate stage of manufacturing operations, which may include a portion of laminating layer formed thereon. In some embodiments, the copper-phosphorous alloy layer 602 can be formed by performing electroless plating operation as discussed in FIG. 1. In some embodiments, a thickness of the copper-phosphorous alloy layer 602 is in a range from about 1 μm to about 3 μm. A photoresist layer 691 is selectively formed over the copper-phosphorous alloy layer 602, wherein a portion of the copper-phosphorous alloy layer 602 is exposed from the photoresist layer 691 by patterning. In some embodiments, the photoresist layer 691 may include a negative photoresist such as polyisoprene rubber or a positive resist such as Novolac resin, an epoxy-based photoresist material (such as SU-8 photoresist, or the like) or polymer material (such as Polymethyl methacrylate (PMMA), or the like).

Figure 6B:
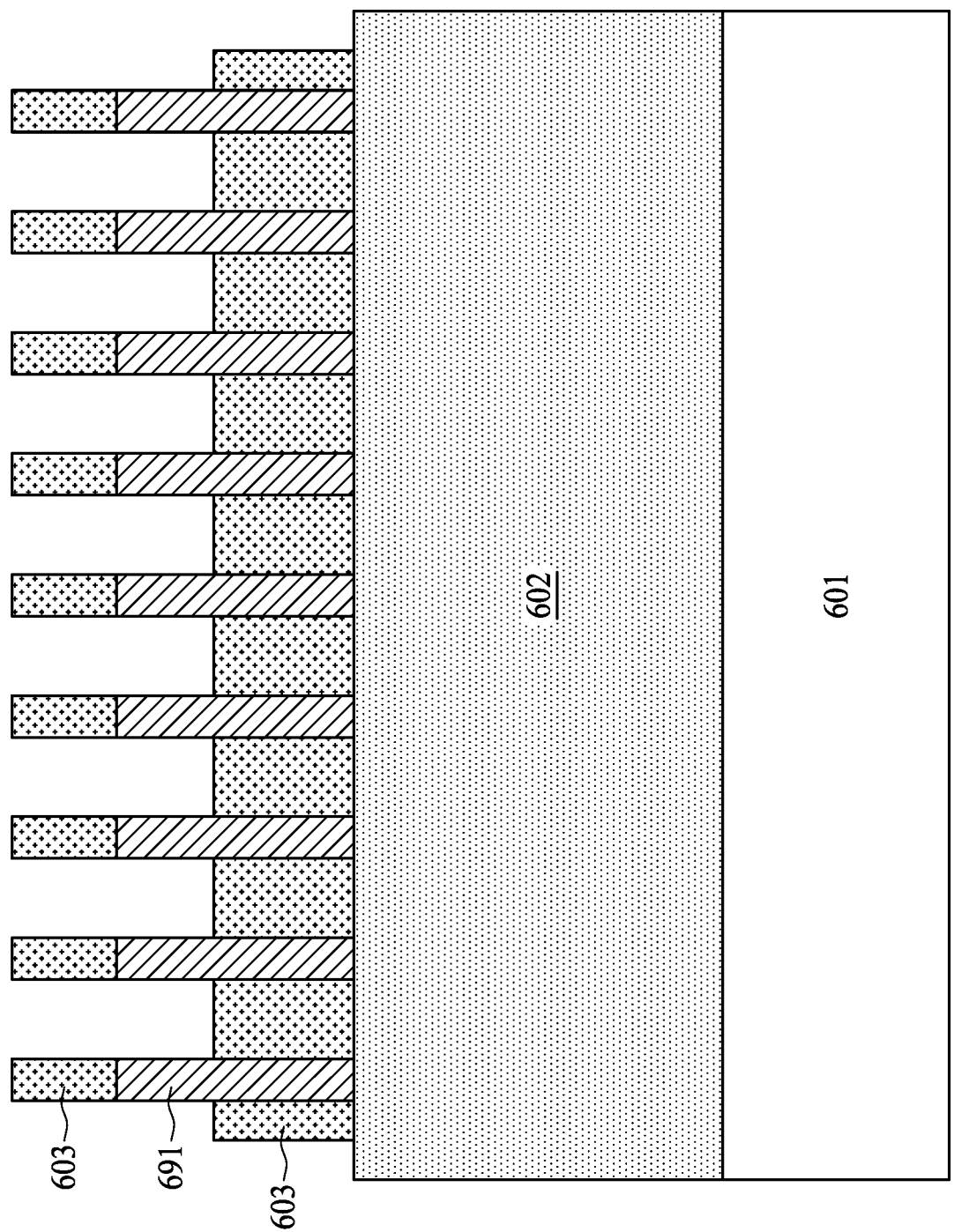

Referring to FIG. 6B, FIG. 6B is a cross section of a multilayer wiring structure during intermediate stages of manufacturing operations, in accordance with some embodiments of the present disclosure. A copper layer 603 is formed over the photoresist layer 691 and the portion of the top surface of the copper-phosphorous alloy layer 602 exposed from the photoresist layer 691. In some embodiments, the copper layer 603 is formed by electroplating operation as discussed in FIG. 2. In some alternative embodiments, the copper layer 603 can be replaced with an additional copper-phosphorous alloy layer (in some cases, such layer can be formed by electroplating operation).

Figure 6C:
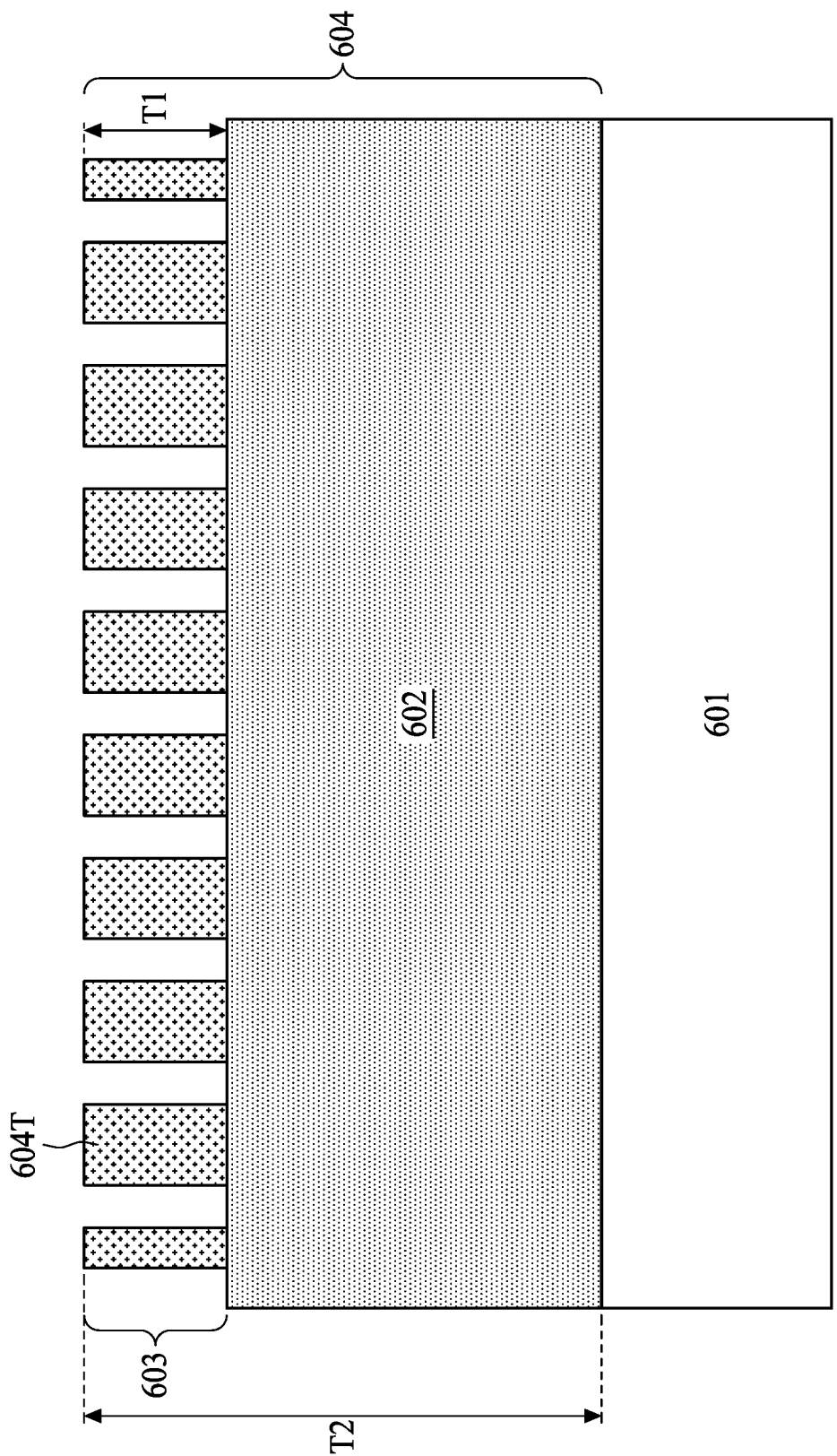
Figure 6D:
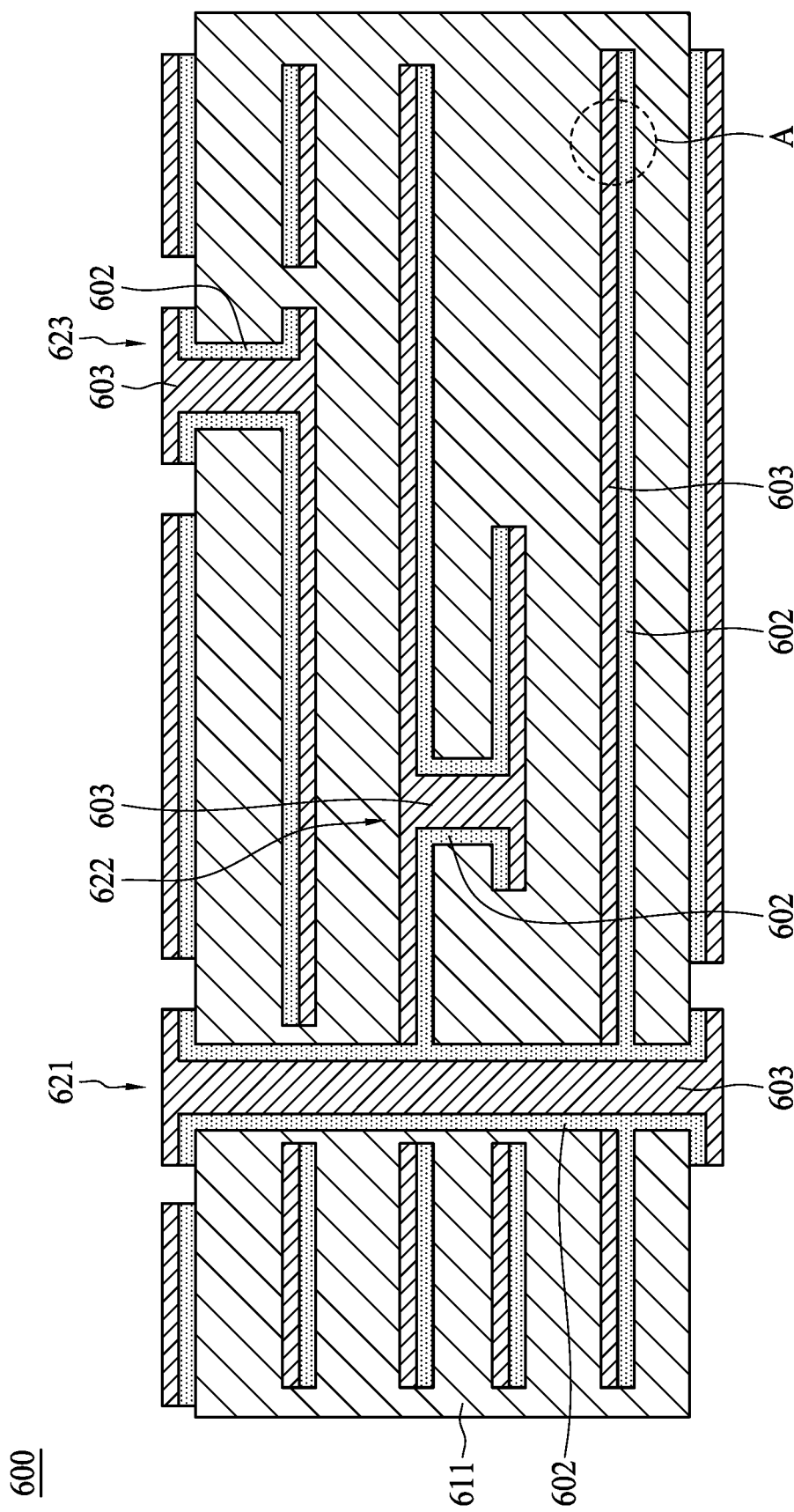
FIG. 6D is a cross section of a multilayer wiring structure during intermediate stages of manufacturing operations, in accordance with some embodiments of the present disclosure.

Referring to FIG. 6C, FIG. 6C is a cross section of a multilayer wiring structure during intermediate stages of manufacturing operations, in accordance with some embodiments of the present disclosure. A photoresist removal operation is performed. Note the photoresist removal operation hereby performed utilizes a negative photoresist such as polyisoprene rubber or a positive resist such as Novolac resin or their equivalents as the photoresist, which are capable of forming a thinner layer compared to the conventional epoxy-based photoresist material (such as SU-8, PMMA, or the like) and complete an unconventional lift-off operation to remove the photoresist layer 691 and a portion of the copper layer 603 directly above the photoresist layer 691. After the photoresist removal operation, a portion of the copper layer 603 is remained. In some of the embodiments, a portion of the copper-phosphorous alloy layer 602 may be exposed from the remaining copper layer 603. The copper-phosphorous alloy layer 602 and the remaining copper layer 603 can be collectively referred to as a corrugated conductive line 604, wherein at least a top surface of the corrugated conductive line 604 has a corrugated profile. Alternatively stated, the corrugated conductive line 604 includes protrusions 604T protruding away from the substrate 601. Furthermore, the corrugated conductive line includes a copper phosphide layer and a copper layer in direct contact with the copper phosphide layer. In some embodiments, the operations discussed in FIG. 6B and FIG. 6C can be repeatedly performed to increase a depth T1 of the protrusion 604T wherein a ratio of the depth T1 over a thickness T2 of the corrugated conductive line 604 is about 10% to about 90%. In some embodiments (e.g., for wiring structures in a regular PCB or IC carrier), the thickness T2 may be in a range from about 20 μm to about 60 μm. In some embodiments (e.g., for wiring structures in a high power PCB or a high power IC carrier), the thickness T2 may be up to 100 μm. By having the depth T1 being in a range from about 10% to about 90% of the thickness T2, the effective surface area of the corrugated conductive line 604 can be increased, thereby addressing the resistance issue caused by skin depth effect. Furthermore, the reliability may be sufficient. The ratio may be closer to 10% when a heat capacity of the multilayer wiring structure 600 (as shown in FIG. 6D) is considered as a relatively important factor. The ratio may be closer to 90% when a dissipating surface area of the corrugated conductive line 604 is considered as a relatively important factor.

In some alternative embodiments, the copper layer 603 can be replaced by an additional copper-phosphorous alloy layer, for example, each copper-phosphorous alloy layers may have different composition, so that each copper-phosphorous alloy layers exhibit different properties and functionalities. Each copper-phosphorous alloy layers can be formed by performing electroplating operation as discussed in FIG. 2 or electroless plating operation as discussed in FIG. 1. In some alternative embodiments, instead of copper layer, an additional conductive layer is formed over the copper-phosphorous alloy layer 602. In some alternative embodiments, the sequence of forming a copper-phosphorous alloy layer and a copper layer is reversed, that is, the copper-phosphorous alloy layer over the copper layer has a corrugated profile. For the operation described in FIG. 6A to FIG. 6C, the composition of the plating solution can be adjusted and optimized so that the photoresist layer 691 can be easily peeled off or detached from the copper layer 603 without substantial copper residue being carried away due to the lift off operation. For example, the photoresist layer 691 can be a multilayer structure including a regular resist layer (e.g., positive or negative resist) and a lift-off resist layer (e.g., SU-8 or PMMA), and in general the copper layer 603 can be formed by E-Gun evaporation or sputtering for a layer up to 40 µm thick (for regular PCB or IC carrier), or for a layer up to 1000 µm thick (for high power PCB or high power IC carrier). Alternatively, the copper layer 603 can be formed by an electroplating operation, for example, by reducing the amount of the wetting agent in the electroplating solution, the electroplated product (i.e., the copper layer 603) is less likely to stick to the lift off resist layer during the lift off operation, and the corrugation profile of the corrugated conductive line 604 becomes sharper.

In another embodiment, the photoresist layer 691 can be a single layer structure including a regular resist layer (e.g., positive or negative resist), and an additional patterning operation is performed to pattern the copper-phosphorous alloy layer 602 prior to the copper layer 603 formation. The patterning operation allows trenches being created in the copper-phosphorous alloy layer 602 and thereby increasing the extent of recess in the corrugated structure. Subsequently, the copper layer 603 can be formed by plating a layer up to 3 µm thick (e.g., for interconnection structures in a regular IC carrier), a layer up to 30 µm thick (e.g., for interconnection structures in a high power IC such as IGBT or MOSFET), a layer up to 40 µm thick (e.g., for wiring structures in a regular PCB or IC carrier), or a layer up to 100 µm thick layer (e.g., for wiring structures in a high power PCB or a high power IC carrier). For example, the copper layer 603 can be formed by an electroplating operation, for example, by reducing the amount of the wetting agent and increasing the amount of leveling agent in the electroplating solution, the electroplated product (i.e., the copper layer 603) is less likely to stick to the photoresist layer 691 during the removal operation of the photoresist layer 691, and the corrugation profile of the corrugated conductive line 604 becomes sharper. In addition, although not illustrated in FIG. 6C, an additional copper-phosphorous alloy layer 602 can be conformally formed over the copper layer 603 by using, for example, an electroless plating operation, to protect the underlying copper layer 603 possessing the corrugation features, prevent the same from oxidation, and prevent the copper atom from out-diffusion from the copper layer 603.

Referring to FIG. 6D and FIG. 6D', FIG. 6D is a cross section of a multilayer wiring structure during intermediate stages of manufacturing operations, and FIG. 6D' is a partially enlarged fragmentary diagrammatic views of a portion A of the multilayer wiring structure of FIG. 6D, in accordance with some embodiments of the present disclosure. Laminating layer 611 (such as Ajinomoto build-up film) can be formed to cover the corrugated conductive line 604, thereby at least a portion of the corrugated conductive line 604 is embedded in the multilayer wiring structure 600. In some embodiments, the multilayer wiring structure 600 further includes other conductive features that includes the copper-phosphorous alloy layer 602 and the copper layer 603. In some embodiments, the multilayer wiring structure 600 includes a through via 621 (which can be plated through via or non-plated through via), a buried via 622 electrically connected to the corrugated conductive line 604 and a blind via 623 electrically connected to the corrugated conductive line 604. In some embodiments, the through via 621 (plated), the buried via 622, and the blind via 623 may include copper-phosphorous alloy layer, such as a copper-phosphorous alloy layer 602 at least partially surrounding the copper layer 603 in lateral direction. In some embodiments, additional removal operation can be performed to alter the shape of via for forming the through via 621 (plated), the buried via 622, and the blind via 623. For example, patterning, etching, punching, or other suitable removal operation can be performed to create a corrugated sidewall profile for the through via 621 (plated), the buried via 622, and the blind via 623, thereby alleviating resistance issue. In some embodiments, a (non-plated) through via 621 of a printed circuit board may have a diameter down to about 5 µm or from about 5 µm to about 20 µm, and a height up to about 100 µm or from about 20 µm to about 100 µm. In some embodiments, a (non-plated) through via 621 of an integrated circuit carrier may have a diameter down to 2 µm or from about 2 µm to about 20 µm, and a height up to about 100 µm or from about 20 µm to about 100 µm.

Referring to FIG. 6D and FIG. 6D", FIG. 6D" is a partially enlarged fragmentary diagrammatic views of a portion A of the multilayer wiring structure of FIG. 6D, in accordance with some embodiments of the present disclosure. An alternative embodiment of the corrugated conductive line 604 is shown in FIG. 6D", wherein the difference between the corrugated conductive line 604 shown in FIG. 6D' and FIG. 6D" resides in that the corrugated conductive line 604 in FIG. 6D" includes corrugated profile both at the top surface and at the bottom surface. Alternatively stated, the corrugated conductive line 604 includes protrusions 604T and 604B protruding toward two opposite directions. Alternatively stated, a bottom of the corrugated conductive line 604 has a first portion 604BA in direct contact with the copper-phosphorous alloy layer 602 and a second portion 604BB above the first portion 604BA and apart from the copper-phosphorous alloy layer 602.

In some embodiments, gaps 605 are configured between the protrusions 604B at the bottom surface of the corrugated conductive line 604. In some embodiments, the gaps 605 may be filled with fillers, such as polymer, photoresist (such as SU-8 or PMMA), dielectric layer, or suitable spacer material. In some alternative embodiments, the gaps 605 may be empty (such as filled with air). Herein, the overhanging structure not only increases the effective surface area of the conductive wiring such that the skin depth effect can be alleviated and resistance can be decreased, but also substantially alleviating the parasitic capacitance effect (for example, relative permittivity can be lowered to about 1). Thereby, the transmission speed of signal can be improved.

The forming of the corrugated conductive line 604 shown in FIG. 6D' may further include the step of selectively forming fillers (such as photoresist, polymer, dielectric layer, spacer material, et cetera) over the copper-phosphorous alloy layer 602, forming a copper layer 603 over the fillers, and forming the protrusions 604T over a top surface of the copper layer 603 by using the operation discussed in FIG. 6A to FIG. 6D', which includes lift-off operation(s) for forming corrugated profile. In some of the embodiments, the aforesaid filler is at least partially remained in the gaps 605 between the protrusions 604B after the lift-off operation. In some alternative embodiments, the aforesaid filler is removed in the gaps 605 between the protrusions 604B after the lift-off operation. By having corrugated profile at the top surface and at the bottom surface, the corrugated conductive line 604 in FIG. 6D" can further alleviate the resistance issue caused by skin depth effect. In some of the embodiments, the corrugated conductive line 604 discussed in FIG. 6D' or FIG. 6D" is positioned in proximal to a top surface of the multilayer wiring structure 600. In some of the embodiments, the corrugated conductive line 604 discussed in FIG. 6D' or FIG. 6D" is configured to transmit high frequency signal. In some embodiments, conductive pads including copper-phosphorous alloy (such as $Cu_3P$) can be formed over the multilayer wiring structure 600 (such as by electroless plating operation, electroplating operation, patterning, depositing, or the like), thereby can be further connected to external conductive features.

In some embodiments, the corrugated conductive line 604 in FIG. 6D" can be manufactured by the operations shown in FIG. 7A to FIG. 7H. In FIG. 7A, a copper-phosphorous alloy 701 can be formed on a multilayer wiring structure (e.g., a wafer, a PCB, or an interposer) as a wetting layer, serving as a foundation for the corrugated conductive line subsequently formed. In some embodiments, an additional barrier layer, for example, a TiN layer (not shown) can be formed prior to the formation of the copper-phosphorous alloy 701. A regular photoresist 702 (e.g., can be a positive or a negative resist) is patterned over the copper-phosphorous alloy 701 and the dielectric regions 701D surrounding the copper-phosphorous alloy 701 with a plurality of trenches that exposes the underlying copper-phosphorous alloy 701. In FIG. 7B, a plating operation is performed to form a copper layer 703 over the photoresist 702 and filling the trenches patterned therein. In some embodiments, a thickness of the copper layer 703 is smaller than that of the photoresist 702 so that the top surface of the photoresist 702 is higher than the top surface of the copper layer 703 filling the trenches. In FIG. 7C, an etching operation is performed to remove the portion of the copper layer 703 on top of the photoresist 702. The other portion of the copper layer 703 that fills the trenches may also be consumed by a limited amount due to the shielded position in view of the adjacent higher photoresist 702. In FIG. 7D, a plating operation can be performed to form another portion of the copper layer 703' covering the top surface of the photoresist 702 exposed by the etching operation as well as the portion of the copper layer 703 filling the trenches.

In FIG. 7E, a regular photoresist 702' (e.g., can be a positive or a negative resist) is patterned over the copper layer 703' and the dielectric regions 701D surrounding the copper-phosphorous alloy 701 with a plurality of trenches that exposes the underlying copper layer 703'. In FIG. 7F, a plating operation is performed to form yet another portion of the copper layer 703" over the photoresist 702 and filling the trenches patterned therein. In some embodiments, a thickness of the copper layer 703" is smaller than that of the photoresist 702' so that the top surface of the photoresist 702' is higher than the top surface of the copper layer 703" filling the trenches. In FIG. 7G, the photoresist 702 and photoresist 702' are removed in a single stripping operation, and the portions of the copper layer 703, 703" being the corrugated features of the corrugated conductive line 603 as previously shown in FIG. 6D". Although not illustrated in FIG. 7H, an additional copper-phosphorous alloy layer 704 can be conformally formed over the copper layer 703', 703" by using, for example, an electroless plating operation, to protect the underlying copper layer 703, 703', 703" possessing the corrugation features, prevent the same from oxidation, and prevent the copper atom from out-diffusion from the copper layer 703, 703', 703".

The techniques discussed in FIG. 6A to FIG. 6D" can further be applied to IC and IC interposer. For example, a wiring of the IC or IC interposer may include a copper-phosphorous alloy layer (such as $Cu_3P$) and a copper layer in direct contact with the copper-phosphorous alloy layer. In some embodiments, the wiring of an integrated circuit may have corrugated profile as discussed in FIG. 6C to FIG. 6D". In some embodiments, a thickness of the copper-phosphorous alloy (such as $Cu_3P$) layer may be in a range from about 2 nm to about 20 nm, and a thickness of the copper layer may be in a range from about 20 nm to about 2,000 nm.

In some embodiments, the wiring of an integrated circuit interposer may have corrugated profile as discussed in FIG. 6C to FIG. 6D". In some embodiments, a thickness of the copper-phosphorous alloy (such as $Cu_3P$) layer may be up to about 200 nm or from about 20 nm to about 200 nm, and a thickness of the copper layer may be up to about 20 μm or from about 5 μm to about 20 μm. A through silicon via formed in the integrated circuit interposer may have a width being down to 5 μm or from about 5 μm to about 20 μm, and a height being up to about 60 μm or from about 20 μm to about 60 μm.

Furthermore, a heat dissipater including the copper-phosphorous alloy (such as $Cu_3P$) layer as discussed in the present disclosure can be incorporated into the embodiments discussed in present disclosure, including but not limited to, wafer substrate, PCB, interposer, redistribution layer, core substrate, coreless substrate, ceramic substrate, or the like. For example, the heat dissipater can include a Ni thin film (with a thickness being in a range from about 0.5 μm to about 2 μm), a copper-phosphorous alloy layer (with a thickness being in a range from about 2 μm to about 20 μm) over the Ni thin film, and a copper layer (with a thickness being in a range from about 200 μm to about 2,000 μm) over the copper-phosphorous alloy layer. The copper-phosphorous alloy layer may exhibit great heat conduction and the ability of alleviating oxidation. For example, the aforesaid heat dissipater can be further formed over a surface of the wiring substrate 300 as discussed in FIG. 3A, a surface of the wiring substrate 300' as discussed in FIG. 3B, a wiring substrate 400 as discussed in FIG. 4A to FIG. 4E, a surface of semiconductor substrate 501 or a surface of a carrier 599 as discussed in FIG. 5A to FIG. 5H, or a surface of the multilayer wiring structure as discussed in FIG. 6A to FIG. 6D".

The present disclosure provides methods for forming semiconductor device (such as integrated circuit, IC interposer, or the like), integrated circuit carrier and printed circuit board (PCB) utilizing copper-phosphorous alloy, such as copper(I) phosphide ($Cu_3P$), to replace conventional copper sputtering operation. Copper sputtering often faces the issue of causing defects in advanced technology node. For example, especially when fabricating a high aspect ratio via, the deposited material may be stuck at an opening of a recess, thereby forming voids in the via and causing reliability issues.

Comparing to sputtered copper in comparative embodiment, copper-phosphorous alloy may exhibit improved ability regarding anti-corrosive, wear resistance, wettability, more condensed structure, strength, toughness, conformability, processability, et cetera. In addition, the electrical conductivity and the thermal conductivity of copper-phosphorous alloy is comparative to sputtered copper. Additionally, copper-phosphorous alloy can also be utilized as a wetting layer for a copper layer, which can alleviate void issues and facilitate the conformability of copper layer in a high aspect ratio via.

Embodiments of electroless plating operations and electroless plating system are discussed in FIG. 1. Advantages of electroless plating technique include compatibility and product quality, wherein the void issues and reliability issues can be alleviated. Furthermore, the electroless plating system can be utilized to form $Cu_3P$ coating and Cu coating by using plating solutions under different conditions, which can be controlled by the electroless plating system 100. The plating solution discussed in FIG. 1 further includes chemicals that further improves the product quality.

Embodiments of electroplating operations and electroplating system are discussed in FIG. 2. Advantages of the electroplating technique include high reaction rate and greater throughput. Furthermore, the electroplating system can be utilized to form $Cu_3P$ coating or Cu coating by using plating solutions 201 with different compositions.

Wetting layers for improving the formation of conductive features can be formed by electroless plating operation as discussed in FIG. 1 or electroplating operation as discussed in FIG. 2. Furthermore, $Cu_3P$ layer can be utilized as a wetting layer (and deoxidization layer) for forming a Cu layer thereon. For example, the $Cu_3P$ layer is in direct contact with the Cu layer. Therefore, the techniques discussed in FIG. 1 and FIG. 2 can be combined, for example, forming a $Cu_3P$ layer by an electroless plating operation as discussed in FIG. 1, and followed by forming a Cu layer by an electroplating operation as discussed in FIG. 2. Such techniques may optimize the balance of reliability and throughput. For example, such techniques can be applied to the embodiments of a wiring substrate 300 (as discussed in FIG. 3A) that includes a core substrate, a wiring substrate 300' (as discussed in FIG. 3B) that includes a coreless substrate, and a wiring substrate 400 (as discussed in FIG. 4A to FIG. 4E) that includes a ceramic substrate. Alternatively, copper formed by electroless plating operation as discussed in FIG. 1 or electroplating operation as discussed in FIG. 2 may also be utilized as wetting layer for improving reliability.

The aforesaid techniques can further be utilized in the interconnect package structure as discussed in FIG. 5A to FIG. 5H, which utilizes a copper-phosphorous alloy layer (such as $Cu_3P$) as a UBM layer over the diffusion barrier layer and a copper layer over the UBM layer, thereby forming a pillar. Such technique can further improve the reliability of bonding. In some embodiments, a height of the copper layer 506 as shown in FIG. 5G can be up to about 60 μm.

The aforesaid techniques can further be utilized in the interconnect package structure as discussed in FIG. 6A to FIG. 6D", wherein a combination of a copper-phosphorous alloy layer (such as $Cu_3P$) and a copper layer may allow complexed configuration of conductive paths in the printed circuit board (PCB) and integrated circuit (IC) carrier, in order to address the issues caused by skin depth effect. Particularly, by forming a corrugated profile at a top surface and/or a bottom surface of the corrugated conductive line 604, the issues caused by skin depth effect may be alleviated. The corrugated profile constitutes an overhanging structure (either at top surface or lower surface, filled with filler or air). Such configuration not only increases the effective surface area of the conductive wiring such that the skin depth effect can be alleviated and resistance can be decreased, but also substantially alleviating the parasitic capacitance effect (for example, relative permittivity can be lowered to about 1). Thereby, the transmission speed of signal can be improved. The electroless plating operation as discussed in FIG. 1 and the electroplating operation as discussed in FIG. 2 can be incorporated with a lift-off operation to form the corrugated profile.

Some embodiments of the present disclosure provide a multilayer wiring structure, including a plurality of dielectric layers, a plurality of conductive wiring layers interleaved with the plurality of dielectric layers, wherein the plurality of conductive wiring layers includes copper-phosphorous alloys.

Some embodiments of the present disclosure provide interconnect package structure, including a substrate, a conductive pad over the substrate, wherein the conductive pad includes copper-phosphorous alloys.

Some embodiments of the present disclosure provide method for forming a wiring structure, including forming a copper-phosphorous alloy layer over a carrier by performing a plating operation, and forming a dielectric layer over the patterned copper-phosphorous alloy layer, wherein forming the patterned copper-phosphorous alloy layer comprises providing a plating solution having a copper source and a phosphorous source.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A multilayer wiring structure, comprising:
   a plurality of lamination layers; and a plurality of conductive wiring layers interleaved with the plurality of lamination layers, wherein the plurality of conductive wiring layers comprises copper-phosphorous alloys, wherein a phosphorous constituent in the copper-phosphorous alloys is in a range from 13.98% to 14.39%, wherein the plurality of conductive wiring layers further comprises a corrugated conductive line having at least two protrusions, and an air gap is between the two protrusions.

2. The multilayer wiring structure of claim 1, wherein the plurality of lamination layers comprises epoxy-based materials, resin-based materials, polymer-based materials, ceramic, or silicon.

3. The multilayer wiring structure of claim 1, wherein the corrugated conductive line has a first plurality of protrusions at a top surface of the corrugated conductive line.

4. The multilayer wiring structure of claim 3, wherein the corrugated conductive line comprises a copper-phosphorus layer and a copper layer in direct contact with the copper-phosphorus layer.

5. The multilayer wiring structure of claim 3, further comprising a second plurality of protrusions at a bottom surface of the corrugated conductive line.

6. The multilayer wiring structure of claim 3, wherein the corrugated conductive line is configured to transmit high frequency signal.

7. The multilayer wiring structure of claim 3, wherein the corrugated conductive line is positioned in proximal to a top surface of the multilayer wiring structure.

8. The multilayer wiring structure of claim 3, further comprising a conductive via electrically connecting corrugated conductive lines, wherein the conductive via comprises $Cu_3P$ and copper.

9. The multilayer wiring structure of claim 1, wherein the copper-phosphorous alloys comprise $Cu_3P$.

10. The multilayer wiring structure of claim 1, wherein at least a portion of the copper-phosphorous alloys is embedded in the lamination layers.

11. The multilayer wiring structure of claim 1, wherein one of the conductive wiring layers comprises a copper-phosphorus layer and a copper layer, wherein the copper-phosphorus layer interposes between the copper layer and one of the plurality of lamination layers.

12. A multilayer wiring structure, comprising:
a circuit board, comprising:
a laminating structure; and
a conductive feature comprising a copper layer and a copper-phosphorous alloy layer, wherein the copper-phosphorous alloy layer is between the copper layer and the laminating structure,
wherein the conductive feature further comprises a conductive wiring extending along a horizontal direction, wherein the conductive wiring comprises a corrugated surface profile.

13. The multilayer wiring structure of claim 12, wherein the conductive wiring is configured to transmit high frequency signal.

14. The multilayer wiring structure of claim 12, wherein the corrugated surface profile comprises a plurality of first protrusions extending from a primary portion of the conductive wiring and protruding toward a first direction.

15. The multilayer wiring structure of claim 14, wherein the corrugated surface profile comprises a plurality of second protrusions extending from the primary portion of the conductive wiring and protruding toward a second direction opposite to the first direction.

16. The multilayer wiring structure of claim 15, further comprising a filler between two of second protrusions, wherein the filler comprises a material different from the laminating structure, the material of the filler comprising polymer or photoresist.

17. The multilayer wiring structure of claim 15, further comprising an empty gap between two of second protrusions.

18. The multilayer wiring structure of claim 12, wherein the copper-phosphorous alloy layer is in direct contact with the laminating structure.

19. The multilayer wiring structure of claim 12, wherein the copper-phosphorous alloy layer comprises $Cu_{3-x}P$, where x is less than 0.1.

20. The multilayer wiring structure of claim 12, wherein the copper-phosphorous alloy layer is under a projection area of the copper layer.

21. A multilayer wiring structure, comprising:
a circuit board, comprising:
a laminating structure laminated on a first plane; and
a vertical via extending through the laminating structure along a direction perpendicular to the first plane;
a copper-phosphorous alloy layer lining between a sidewall of the vertical via and the laminating structure; and
a horizontal conductive line parallel to the first plane connected to the vertical via, wherein the horizontal conductive line is configured to transmit a high frequency signal, and wherein the horizontal conductive line has a corrugated profile.

22. The multilayer wiring structure of claim 21, wherein the vertical via further comprises a copper layer laterally surrounded by the copper-phosphorous alloy layer.

23. The multilayer wiring structure of claim 21, wherein the horizontal conductive line comprises copper-phosphorous alloy.

* * * * *

UNITED STATES PATENT AND TRADEMARK OFFICE
CERTIFICATE OF CORRECTION

| | |
|---|---|
| PATENT NO. | : 11,842,958 B2 |
| APPLICATION NO. | : 17/697937 |
| DATED | : December 12, 2023 |
| INVENTOR(S) | : Chun-Ming Lin |

It is certified that error appears in the above-identified patent and that said Letters Patent is hereby corrected as shown below:

In the Claims

Claim 1 should read:
1. A multilayer wiring structure, comprising:
a plurality of lamination layers; and
a plurality of conductive wiring layers interleaved with the plurality of lamination layers, wherein the plurality of conductive wiring layers comprises copper-phosphorous alloys, wherein a phosphorous constituent in the copper-phosphorous alloys is in a range from 13.98% to 14.39%, wherein the plurality of conductive wiring layers further comprises a corrugated conductive line having at least two protrusions, and an air gap is between the at least two protrusions.

Claim 6 should read:
6. The multilayer wiring structure of Claim 3, wherein the corrugated conductive line is configured to transmit a high frequency signal.

Claim 7 should read:
7. The multilayer wiring structure of Claim 3, wherein the corrugated conductive line is positioned proximal to a top surface of the multilayer wiring structure.

Claim 8 should read:
8. The multilayer wiring structure of Claim 3, further comprising a conductive via electrically connecting to a plurality of the corrugated conductive line, wherein the conductive via comprises $Cu_3P$ and copper.

Claim 11 should read:
11. The multilayer wiring structure of Claim 1, wherein one of the conductive wiring layers comprises a copper-phosphorus layer and a copper layer, wherein the copper-phosphorus layer is interposed between the copper layer and one of the plurality of lamination layers.

Signed and Sealed this
Thirtieth Day of January, 2024

*Katherine Kelly Vidal*
Katherine Kelly Vidal
*Director of the United States Patent and Trademark Office*

CERTIFICATE OF CORRECTION (continued)
U.S. Pat. No. 11,842,958 B2

Claim 13 should read:
13. The multilayer wiring structure of Claim 12, wherein the conductive wiring is configured to transmit a high frequency signal.

Claim 15 should read:
15. The multilayer wiring structure of Claim 14, wherein the corrugated
surface profile further comprises a plurality of second protrusions extending from the primary portion of the conductive wiring and protruding toward a second direction opposite to the first direction.

Claim 16 should read:
16. The multilayer wiring structure of Claim 15, further comprising a
filler between two of the second protrusions, wherein the filler comprises a material different from the laminating structure, the material of the filler comprising polymer or photoresist.

Claim 17 should read:
17. The multilayer wiring structure of Claim 15, further comprising an
empty gap between two of the second protrusions.

Claim 21 should read:
21. A multilayer wiring structure, comprising:
a circuit board, comprising:
a laminating structure laminated on a first plane;
a vertical via extending through the laminating structure along a direction
perpendicular to the first plane; and
a copper-phosphorous alloy layer lining between a sidewall of the vertical via and
the laminating structure; and
a horizontal conductive line parallel to the first plane connected to the vertical via,
wherein the horizontal conductive line is configured to transmit a high frequency signal, and wherein the horizontal conductive line has a corrugated profile.

Claim 23 should read:
23. The multilayer wiring structure of Claim 21, wherein the horizontal
conductive line comprises copper-phosphorous alloys.